United States Patent
Long et al.

(10) Patent No.: US 12,453,260 B2
(45) Date of Patent: Oct. 21, 2025

(54) DISPLAY PANEL AND TERMINAL DEVICE WITH REFERENCE ANODE AND OFFSET ANODE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Zhenhua Zhang, Beijing (CN); Hongli Wang, Beijing (CN); Jianchang Cai, Beijing (CN); Lina Wang, Beijing (CN); Jing Zhang, Beijing (CN); Changlong Yuan, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/911,149

(22) PCT Filed: Aug. 23, 2021

(86) PCT No.: PCT/CN2021/114099
§ 371 (c)(1),
(2) Date: Sep. 13, 2022

(87) PCT Pub. No.: WO2023/023897
PCT Pub. Date: Mar. 2, 2023

(65) Prior Publication Data
US 2024/0224636 A1    Jul. 4, 2024

(51) Int. Cl.
*H10K 59/131* (2023.01)
*H10K 59/80* (2023.01)
*H10K 59/35* (2023.01)

(52) U.S. Cl.
CPC ..... *H10K 59/131* (2023.02); *H10K 59/80515* (2023.02); *H10K 59/35* (2023.02)

(58) Field of Classification Search
CPC . H10K 59/131; H10K 59/80515; H10K 59/35
See application file for complete search history.

(56) References Cited

U.S. PATENT DOCUMENTS

| 2014/0287546 A1 | 9/2014 | Yamazaki |
| 2020/0312832 A1* | 10/2020 | Chi ..................... H10K 59/1315 |

(Continued)

FOREIGN PATENT DOCUMENTS

| CN | 108376696 A | 8/2018 |
| CN | 109950284 A | 6/2019 |

(Continued)

OTHER PUBLICATIONS

Written Opinion from PCT/CN2021/114099 dated May 25, 2022.

*Primary Examiner* — Lex H Malsawma
(74) *Attorney, Agent, or Firm* — Calfee, Halter & Griswold LLP

(57) ABSTRACT

A display panel includes a base substrate, an assemble layer and an anode layer. The base substrate has a light transmissive area, and the light transmissive area includes at least one transparent display area. The transparent display area has a first boundary and a second being opposite in the row direction, and a third boundary and a fourth boundary being opposite in the column direction. The transparent display area includes at least one section, and the section includes multiple rows of sub-areas arranged in the column direction.

20 Claims, 22 Drawing Sheets

(56) References Cited

U.S. PATENT DOCUMENTS

| | | | |
|---|---|---|---|
| 2021/0012706 A1* | 1/2021 | Yang | G09G 3/32 |
| 2021/0193758 A1* | 6/2021 | Choi | H10K 59/123 |
| 2022/0069047 A1* | 3/2022 | Yang | H10K 59/131 |

FOREIGN PATENT DOCUMENTS

| | | | |
|---|---|---|---|
| CN | 110504289 A | 11/2019 | |
| CN | 110690360 A | 1/2020 | |
| CN | 111162199 A | 5/2020 | |
| CN | 111584609 A | 8/2020 | |
| CN | 112117320 A | 12/2020 | |
| CN | 109950284 B | 1/2021 | |
| CN | 212542439 U | 2/2021 | |
| WO | 2021147081 A1 | 7/2021 | |
| WO | 2021249016 A1 | 12/2021 | |

* cited by examiner

211e

DISPLAY PANEL AND TERMINAL DEVICE WITH REFERENCE ANODE AND OFFSET ANODE

CROSS-REFERENCE TO RELATED APPLICATION

The present application is a 35 U.S.C. 371 national phase application of PCT International Application No. PCT/CN2021/114099 filed on Aug. 23, 2021, the entire disclosure of which is incorporated herein by reference for all purposes.

TECHNICAL FIELD

The present disclosure relates to the field of display technology, and in particular, to a display panel and a terminal device.

BACKGROUND

For the screen of an electronic device with a camera such as a mobile phone and a tablet computer, the area in the screen corresponding to the camera usually needs to have an opening. This renders that no light can be emitted, which is not conducive to improving the screen ratio. At present, although an off-screen camera technology is provided which allows the area where the camera is located to display images, avoids openings, and shoot normally, the area in the screen corresponding to the camera is prone to severe mura (also referred to as uneven brightness), which affects the display effect.

SUMMARY

The purpose of the present disclosure is to provide a display panel and a terminal device, so as to overcome, at least to a certain extent, one or more problems due to limitations and defects of the related art.

A first aspect of the present disclosure provides a display panel, comprising a base substrate, an assemble layer formed on the base substrate, and an anode layer located on a side of the assemble layer away from the base substrate.

The base substrate has a light transmissive area, the light transmissive area includes at least one transparent display area, and the transparent display area has a first boundary and a second boundary being opposite in the row direction, and a third boundary and a fourth boundary being opposite in the column direction. The transparent display area includes at least one section, and the section includes multiple rows of sub-areas arranged in the column direction, and the sub-area includes a row of pixel areas and a row of assemble areas sequentially arranged in the column direction. The assemble area is provided with an assemble hole. The at least one section includes a first section.

The assemble layer includes a plurality of leads, and some of the leads are located in the first section. In the sub-area of the first section, the number of the leads gradually decreases along a direction from the first boundary to the second boundary, and the size of the lead in the row direction gradually decreases along a direction from the third boundary to the fourth boundary.

The anode layer includes a plurality of anodes. The anode has an electrode part and a wiring part connected to each other. At least part of the electrode part is located in the pixel area, and at least part of the wiring part is located in the assemble area and connected to the part of the lead located in the assemble area through an assemble hole. The plurality of anodes at least include a plurality of first anodes. The plurality of first anodes at least include a first reference anode and a first offset anode on the sub-area located in the sub-area of the first section and arranged at intervals in the row direction. In the column direction, the center of the electrode part of the first offset anode is located at a side of the center of the electrode part of the first reference anode close to the side of the third boundary.

In an exemplary embodiment of the present disclosure, the first section has N rows of sub-areas, and N is a positive integer greater than 1.

In the pixel area of the sub-area in the n-th row of the first section, the first offset anode is located at a side of the first reference anode close to the second boundary.

In the pixel area of the sub-area in the (n+1)-th row of the first section, the first offset anode is located at a side of the first reference anode close to the first boundary.

In the row direction, the first reference anode in the pixel area of the sub-area in the n-th row of the first section is located at a side of the first offset anode in the pixel area of the sub-area in the (n+1)-th row of the first section close to the first boundary.

In the row direction, the first offset anode in the pixel area of the sub-area in the n-th row of the first section is located between the first offset anode and the first reference anode in the pixel area of the sub-area in the (n+1)-th row of the first section.

$1 \leq n < N$, and n is a positive integer.

In an exemplary embodiment of the present disclosure, the plurality of anodes includes a plurality of anode groups. The anode group includes the first anode, a second anode, a third anode and a fourth anode. The second anode and the fourth anode have the same light emission color, and the first anode, the second anode and the third anode have different light emission colors.

The assemble area of the sub-area is provided with a plurality of assemble hole groups arranged at intervals in the row direction. The assemble hole group includes four assemble holes arranged at intervals in the row direction, which are respectively defined as a first assemble hole correspondingly connected with the first anode, a second assemble hole correspondingly connected with the second anode, a third assemble hole correspondingly connected with the third anode, and a fourth assemble hole correspondingly connected to the fourth anode.

In an exemplary embodiment of the present disclosure, in the anode group: the wiring parts in the first anode, the second anode, the third anode and the fourth anode are in one-to-one correspondence with the assemble holes in the same assemble area; and at least 30% of the electrode parts of the first anode, the second anode, and the third anode are located in the pixel area of the sub-area in the same row, and at least 30% of the electrode part of the fourth anode is located in the pixel area of the sub-area in an adjacent row.

In an exemplary embodiment of the present disclosure, in the assemble hole group, the first assemble hole, the second assemble hole, the third assemble hole and the fourth assemble hole are arranged in sequence in the row direction, or the third assemble hole, the fourth assemble hole, the first assemble hole and the second assemble hole are arranged in sequence in the row direction.

Among two adjacent assemble hole groups in the column direction, the first assemble hole of one assemble hole group is located in the same row as the third assemble hole of the other assemble hole groups, and the second assemble hole of one assemble hole groups is located in the same row as the fourth assemble hole of the other assemble hole groups.

In an exemplary embodiment of the present disclosure, the assemble layer includes a first assemble part located in the first section, and the first assemble part includes a plurality of first wiring groups arranged in the column direction. Each of the first wiring groups corresponds to the sub-area of the first section.

The first wiring group includes a first lead, a second lead and a third lead that are sequentially arranged along a direction from the base substrate to the anode layer and insulated from each other.

The first lead includes a first extension segment extending in the row direction and a first lead-out segment extending in the column direction. The first extension segment is located in the pixel area of the sub-area. One end of the first lead-out segment is located in the pixel area of the sub-area and connected to an end of the first extension segment away from the first boundary. The other end of the first lead-out segment is located in the assemble area of the sub-area and connected to the wiring part of an anode through an assemble hole.

The second lead includes a second extension segment extending in the row direction, and the second extension segment is located in the pixel area of the sub-area.

The third lead includes a third extension segment extending in the row direction, and the third extension segment is located in the pixel area of the sub-area.

In an exemplary embodiment of the present disclosure, in the sub-area of the first section: along a direction from the first boundary to the second boundary, the number of the first extension segments gradually decreases, and the length of the first lead-out segment gradually increases; and along a direction from the third boundary to the fourth boundary, the length of the first extension segment gradually decreases; and/or, along a direction from the first boundary to the second boundary, numbers of the second extension segments and the third extension segments are unchanged.

In an exemplary embodiment of the present disclosure, in the sub-area of the first section, the overlapping area on the base substrate between at least one of the first extension segments and the third extension section is larger than the overlapping area on the base substrate between the at least one of the first extension segments and the second extension segment.

In an exemplary embodiment of the present disclosure, the pixel area of the sub-area has a center line extending in the row direction. The center line is separated by a first distance from an extension segment closest to the third boundary among the first extension segment, the second extension segment and the first extension segment of the first wiring group. The center line is separated by a second distance from an extension segment farthest from the third boundary among the first extension segment, the second extension segment and the first extension segment of the first wiring group. The first distance and the second distance are dimensions in the column direction, and the first distance and the second distance are equal to each other.

In the sub-area of the first section, the center of the electrode part of the first offset anode is located at a side close to the third boundary of the center line of the pixel area where it is located.

In an exemplary embodiment of the present disclosure, in the sub-area of the first section, the center of the electrode part of at least one of the first reference anodes is located at the center line of the pixel area where it is located.

In an exemplary embodiment of the present disclosure, in the sub-area of the first section, an overlap exists between orthographic projections on the base substrate of the top end of the electrode part of at least part of the first offset anode and an extension segment closest to the third boundary among the first extension segment, the second extension segment and the third extension segment of the first wiring group.

In an exemplary embodiment of the present disclosure, in the first section: no overlap exists between the orthographic projections on the base substrate of the first lead-out segment and the electrode part of at least one of the second anodes; and/or, an overlap exists between the orthographic projections on the base substrate of the first lead-out segment and the electrode part of at least one of the second anodes.

In an exemplary embodiment of the present disclosure, in the first section: an overlap exists between orthographic projections on the base substrate of the bottom end of the electrode part of at least one of the third anodes and an extension segment farthest from the third boundary among the first extension segment, the second extension segment and the third extension segment of the first wiring group; and/or, no overlap exists between the orthographic projection on the base substrate of the electrode part of at least one of the third anodes and the orthographic projection on the base substrate of the first lead-out segment.

In an exemplary embodiment of the present disclosure, in the first section: no overlap exists between orthographic projections on the base substrate of the bottom end of the electrode part of at least one of the third anodes and an extension segment farthest from the third boundary among the first extension segment, the second extension segment and the third extension segment of the first wiring group; an overlap exists between the orthographic projections on the base substrate of the first lead-out segment and the electrode part of at least one of the third anodes; and/or, no overlap exists between the orthographic projections on the base substrate of the electrode part of each of the fourth anodes and the first lead-out segment.

In an exemplary embodiment of the present disclosure, the at least one section of the transparent display area further includes a second section, and the second section is located at a side of the first section close to the second boundary.

The assemble layer further includes a second assemble part located in the second section, and the second assemble part includes a plurality of fourth leads arranged on the same layer as the first lead, a plurality of fifth leads arranged on the same layer as the second lead, and a plurality of sixth leads arranged on the same layer as the third lead.

The fourth lead includes a fourth extension segment extending in the column direction, and an orthographic projection on the base substrate of the fourth extension segment is located in the pixel area and the assemble area of the sub-area, and does not overlap with the orthographic projection on the base substrate of the assemble hole.

The fifth lead includes a fifth extension segment extending in the row direction, and the fifth extension segment is located in the pixel area of the sub-area.

The sixth lead includes a sixth extension segment extending in the row direction, and the sixth extension segment is located in the pixel area of the sub-area. At least part of the sixth lead further includes a sixth lead-out segment extending in the column direction. One end of the sixth lead-out segment is located in the pixel area of the sub-area and connected to an end of the sixth extension segment away from the first boundary. The other end of the sixth lead-out segment is located in the assemble area of the sub-area and connected to the wiring part of an anode through an assemble hole.

In an exemplary embodiment of the present disclosure, in the sub-area of the second section: along the direction from the first boundary to the second boundary, the length of the sixth lead-out segment gradually increases; and/or, no overlap exists between orthographic projections on the base substrate of the center of the electrode part of at least one of the anodes and the fourth extension segment.

In an exemplary embodiment of the present disclosure, in the sub-area of the second section: no overlap exists between the orthographic projections on the base substrate of the electrode part of at least one of the first anodes and the fourth extension segment; and/or, an overlap exists between the orthographic projections on the base substrate of the fifth extension segment closest to the fourth boundary and the bottom end of the electrode part of at least one of the first anodes; and/or, an overlap exists between the orthographic projections on the base substrate of the fifth extension segment closest to the third boundary and the top end of the electrode part of at least one of the third anodes.

In an exemplary embodiment of the present disclosure, the at least one section of the transparent display area further includes a third section, and the third section is located at a side of the second section away from the first section.

The assemble layer further includes a third assemble part located in the third section, and the third assemble part includes a plurality of seventh leads arranged on the same layer as the first lead, a plurality of eighth leads arranged on the same layer as the second lead, and a plurality of ninth leads arranged on the same layer as the third lead.

The seventh lead includes a seventh extension segment extending in the column direction, and an orthographic projection on the base substrate of the seventh extension segment is located in the pixel area and the assemble area of the sub-area, and does not overlap with the orthographic projection on the base substrate of the assemble hole.

The eighth lead includes an eighth extension segment extending in the row direction, and the eighth extension segment is located in the pixel area of the sub-area. At least part of the eighth lead further includes an eighth lead-out segment extending in the column direction. One end of the eighth lead-out segment is located in the pixel area of the sub-area and connected to an end of the seventh extension segment away from the first boundary. The other end of the eighth lead-out segment is located in the assemble area of the sub-area and connected to the wiring part of an anode through an assemble hole.

The ninth lead includes a ninth extension segment extending in the column direction, and an orthographic projection on the base substrate of the ninth extension segment is located in the pixel area and the assemble area of the sub-area, and does not overlap with the orthographic projection on the base substrate of the assemble hole.

In an exemplary embodiment of the present disclosure, an overlap exists between the orthographic projections on the base substrate of part of the ninth extension segment and the seventh extension segment.

In an exemplary embodiment of the present disclosure, in the sub-area of the third section: along the direction from the first boundary to the second boundary, the length of the eighth lead-out segment gradually increases; and/or, no overlap exists between the orthographic projections on the base substrate of the seventh extension segment and the center of the electrode part of at least one anode.

In an exemplary embodiment of the present disclosure, in the sub-area of the third section, no overlap exists between orthographic projections on the base substrate of the seventh extension segment and the electrode part of at least one of the first anodes, the electrode part of at least one of the second anodes, and the electrode part of at least one of the fourth anodes.

In an exemplary embodiment of the present disclosure, the at least one section of the transparent display area further includes a fourth section, and the fourth section is located at a side of the third section away from the second section.

The assemble layer further includes a fourth assemble part located in the fourth section, and the fourth assemble part includes a plurality of tenth leads arranged on the same layer as the first lead.

The tenth lead includes a tenth extension segment extending in the row direction and a tenth lead-out segment extending in the column direction. The tenth extension segment is located in the pixel area of the sub-area. One end of the tenth lead-out segment is located in the pixel area of the sub-area and connected to an end of the seventh extension segment away from the first boundary. The other end of the tenth lead-out segment is located in the assemble area of the sub-area and connected with the wiring part of an anode through an assemble hole.

In an exemplary embodiment of the present disclosure, in the sub-area of the fourth section: along the direction from the first boundary to the second boundary, the number of the tenth extension segments gradually decreases, and the length of the tenth lead-out segment gradually increases; along the direction from the third boundary to the fourth boundary, the length of the tenth extension segment gradually decreases; and an overlap exists between the orthographic projections on the base substrate of the tenth extension segment closest to the third boundary and the top end of the electrode part of at least one of the first anodes; and no overlap exists between the orthographic projections on the base substrate of the tenth lead-out segment and the electrode part of at least one of the second anodes.

In an exemplary embodiment of the present disclosure, the first section, the second section, the third section and the fourth section are rectangular areas.

In an exemplary embodiment of the present disclosure, the at least one section of the transparent display area further includes a fifth section, and the fifth section is located at a side of the first section, the second section, the third section and the fourth section close to the third boundary.

The assemble layer further includes a fifth assemble part located in the fifth section, and the fifth assemble part includes a plurality of second wiring groups arranged in the column direction. Each of the second wiring groups corresponds to one of the sub-areas of the fifth section. The second wire group includes an eleventh lead arranged on the same layer as the first lead, a twelfth lead arranged on the same layer as the second lead, and a thirteenth lead arranged on the same layer as the third lead.

The eleventh lead includes an eleventh extension segment extending in the row direction and an eleventh lead-out segment extending in the column direction, and the eleventh extension segment is located in the pixel area of the sub-area. One end of the eleventh lead-out segment is located in the pixel area of the sub-area and connected to an end of the eleventh extension segment away from the first boundary. The other end of the eleventh lead-out segment is located in the assemble area of the sub-area and connected to the wiring part of an anode through an assemble hole.

The twelfth lead includes a twelfth extension segment extending in the row direction, and the twelfth extension segment is located in the pixel area of the sub-area.

The thirteenth lead includes a thirteenth extension segment extending in the row direction, the thirteenth extension segment is located in the pixel area of the sub-area, and the thirteenth lead partially away from the third boundary further includes a thirteenth lead-out segment extending in the column direction. One end of the thirteenth lead-out segment is located in the pixel area of the sub-area and connected to an end of the thirteenth extension segment away from the first boundary. The other end of the thirteenth lead-out segment is located in the assemble area of the sub-area and connected to the wiring part of an anode through an assemble hole.

In each sub-area of the fifth section, the length of the twelfth extension segment is equal and the two ends thereof are aligned. Along a direction from the third boundary to the fourth boundary of the fifth section, the length of the twelfth extension segment in the sub-area gradually increases, a segment close to the second boundary of the twelfth extension segment in the sub-area is aligned, and the numbers of the assemble holes and the anodes in each of the sub-areas gradually increase.

In an exemplary embodiment of the present disclosure, in the sub-area of the fifth section: along the direction from the first boundary to the second boundary, the number of the eleventh extension segments gradually decreases, and the length of the eleventh lead-out segment gradually increases; and along a direction from the third boundary to the fourth boundary, the length of the eleventh extension segment gradually decreases.

In an exemplary embodiment of the present disclosure, in the sub-area of the fifth section: the center of the electrode part of at least one of the first anodes is located at a side of the center line of the pixel area close to the fourth boundary.

The center of the electrode part of at least one of the third anodes is located at a side of the center line of the pixel area close to the third boundary.

In an exemplary embodiment of the present disclosure, in the sub-area of the fifth section: no overlap exists between the orthographic projections on the base substrate of the eleventh lead-out segment and the electrode part of at least one of the second anodes; and/or, no overlap exists between the orthographic projections on the base substrate of the eleventh lead-out segment and the electrode part of at least one of the third anodes.

In an exemplary embodiment of the present disclosure, four transparent display areas are provided, which are a first transparent display area, a second transparent display area, a third transparent display area and a fourth transparent display area. The first transparent display area and the second transparent display area are arranged in sequence in the row direction. The third transparent display area and the fourth transparent display area are arranged in sequence in the row direction. The first transparent display area and the third transparent display area are arranged in sequence in the column direction. The second transparent display area and the fourth transparent display area are arranged in sequence in the column direction.

The leads in the first transparent display area and the leads in the second transparent display area are symmetrically arranged with respect to the column direction.

The leads in the third transparent display area and the leads in the fourth transparent display area are symmetrically arranged with respect to the column direction.

The leads in the first transparent display area and the leads in the third transparent display area are symmetrically arranged with respect to the row direction.

The leads in the second transparent display area and the leads in the fourth transparent display area are symmetrically arranged with respect to the row direction.

A second aspect of the present disclosure provides a terminal device, comprising the display panel described in any one of the above embodiments.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and together with the description serve to explain the principle of the present disclosure. Obviously, the drawings in the following description are only some embodiments of the present disclosure, and for those of ordinary skill in the art, other drawings can also be obtained from these drawings without creative effort.

Figure 1:
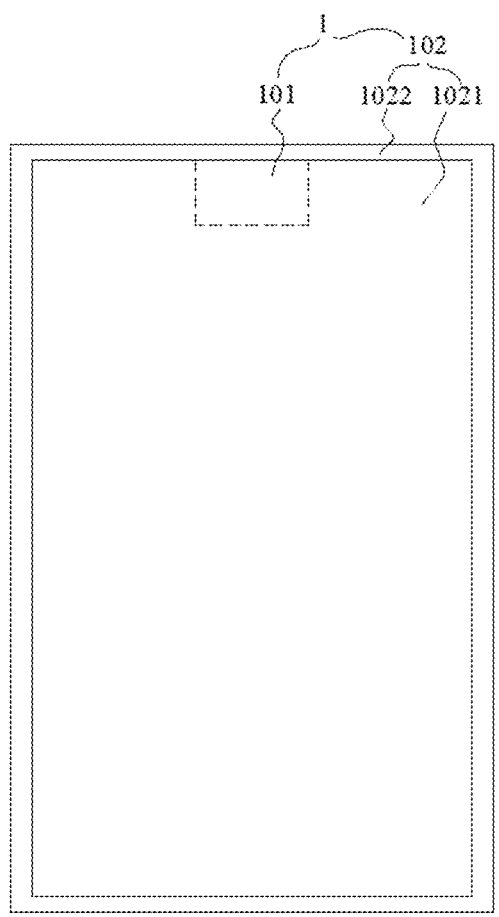
FIG. 1 shows a schematic structural diagram of a base substrate in a display panel according to an embodiment of the present disclosure.

LIST OF REFERENCE NUMERALS 1, base substrate; 101, light transmissive area; 1011, transparent display area; 1011a, first transparent display area; 1011b, second transparent display area; 1011c, third transparent display area; 1011d, fourth transparent display area; 10111, first boundary; 10112, second boundary; 10113, third boundary; 10114, fourth boundary; 102, non-light transmissive area; 1021, display area; 1022, non-display area;

2, assemble layer; 211, lead; 211a, first lead; 211aa, first extension segment; 211ab, first lead-out segment; 211b, second lead; 211c, third lead; 211d, fourth lead; 211e, fifth lead; 211f, sixth lead; 211fa, sixth extension segment; 211fb, sixth lead-out segment; 211g, seventh lead; 211h, eighth lead; 211ha, eighth extension segment; 211hb, eighth lead-out segment; 211j, ninth lead; 211k, tenth lead; 211ka, tenth extension segment; 211r, eleventh lead; 211ra, eleventh extension segment; 211rb, eleventh lead-out segment; 211t, twelfth lead; 211p, thirteenth lead; 211pa, thirteenth extension segment; 211pb, thirteenth lead-out segment; 22, insulation layer; 23, assemble hole; 23a, first assemble hole; 23b, second assemble hole; 23c, third assemble hole; 24d, fourth assemble hole;

3, light-emitting layer; 30, light-emitting device; 301, anode; 301a, first anode; 301b, second anode; 301c, third anode; 301d, fourth anode; 3011, electrode part; 3012, wiring part; 302, organic light-emitting material layer; 303, cathode; 31, pixel definition layer;

100, display panel; 200, camera device.

DETAILED DESCRIPTION OF THE EMBODIMENTS

Example embodiments will now be described more fully with reference to the accompanying drawings. Example embodiments, however, may be embodied in various forms and should not be construed as limited to embodiments set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

The terms "a", "an", "the", "said" and "at least one" are used to indicate the presence of one or more elements or components, etc. The terms "include" and "have" are used to indicate an open-ended inclusion, meaning that additional elements or components, etc. may be present in addition to the listed elements or components, etc. The terms "first", "second" and "third" etc. are only used as a marker, not a limit on the number of relevant objects.

The row direction and the column direction are only two vertical directions, and their specific orientations are not limited. For example, the row direction may be the horizontal X direction shown in the figures, and the column direction may be the vertical Y direction shown in the figures. Those skilled in the art can understand that, if the display panel is rotated, the actual orientation of the row direction and the column direction may change.

Figure 2:
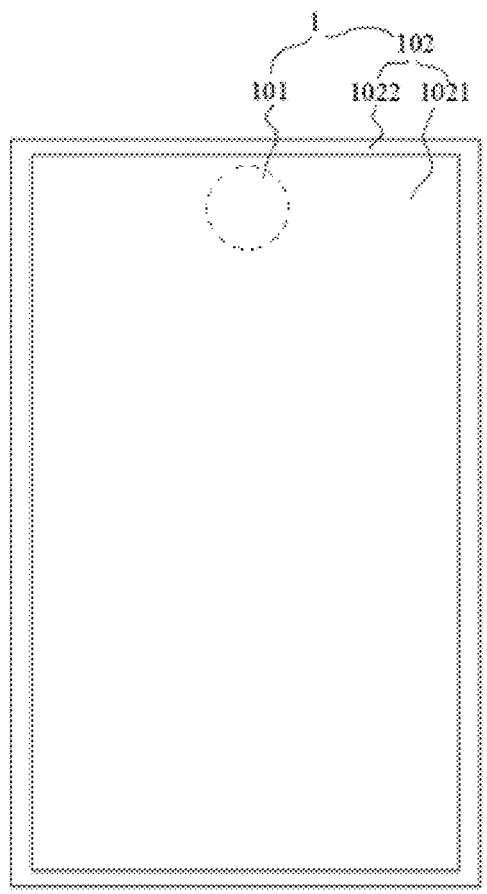
FIG. 2 is a schematic structural diagram of a base substrate in a display panel according to another embodiment of the present disclosure.
Figure 5:
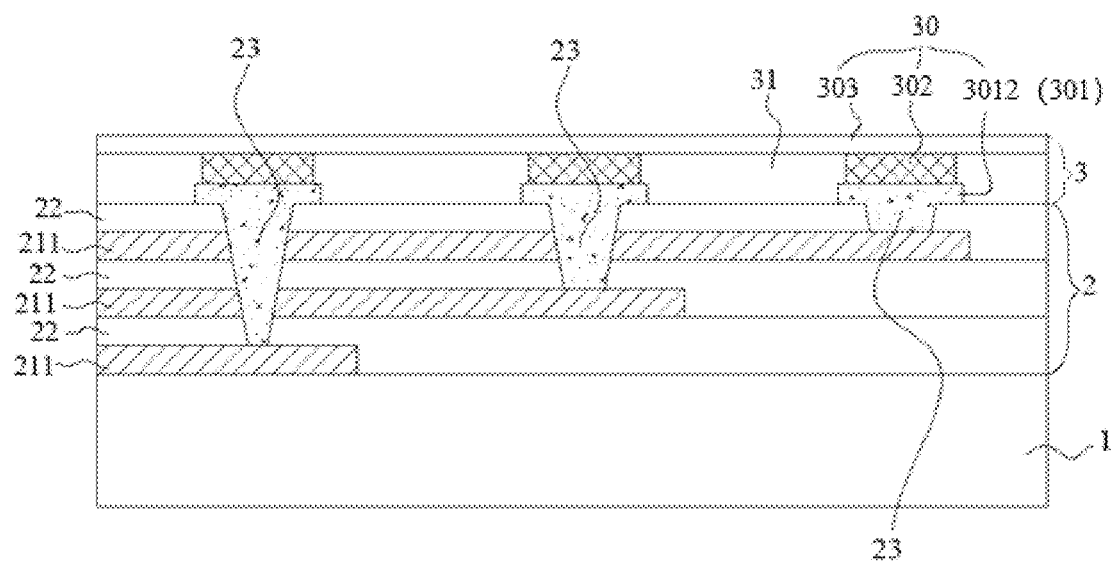
FIG. 5 shows a schematic cross-sectional view of a display panel according to an embodiment of the present disclosure.

An embodiment of the present disclosure provides a display panel, which may be an Organic Light-Emitting Diode (OLED) display panel. With reference to FIGS. 1, 2 and 5, the display panel according to an embodiment of the present disclosure may include a base substrate 1, an assemble layer 2 and a light-emitting layer 3.

The base substrate 1 may have a light transmissive area 101 and a non-light transmissive area 102 at least partially surrounding the light transmissive area 101. For example, the base substrate 1 may be a driving substrate, and a plurality of pixel circuits may be provided in the non-light transmissive area 102 thereof.

Figure 3:
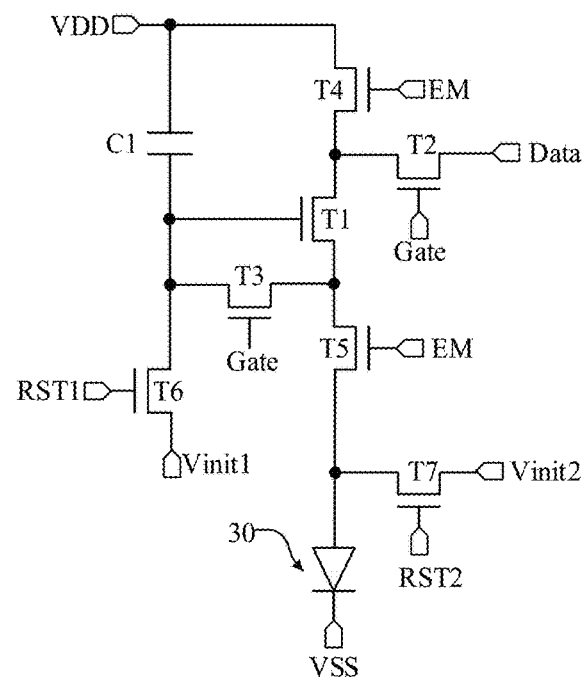
FIG. 3 shows an equivalent schematic diagram of a pixel circuit in a display panel according to an embodiment of the present disclosure.
Figure 4:
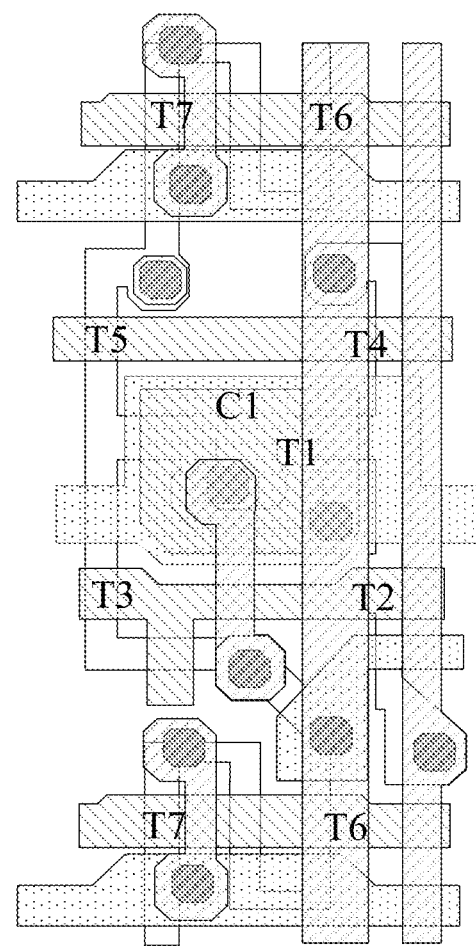
FIG. 4 shows a schematic structural diagram of a pixel circuit in a display panel according to an embodiment of the present disclosure.

For example, as shown in FIG. 3 and FIG. 4, the pixel circuit may have a 7T1C circuit structure, that is, including 7 transistors and 1 capacitor. The 7T1C pixel circuit includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The pixel circuit may be connected to the gate signal terminal Gate, the data signal terminal Data, the reset signal terminals RST1 and RST2, the light-emitting control signal terminal EM, the power terminal VDD, the initial power terminals Vinit1 and Vinit2, and the light-emitting device. The light-emitting device may also be connected to the power terminal VSS. The pixel circuit may be used to drive the connected light-emitting device 30 to emit light in response to signals provided by the connected signal terminals.

In addition, transistors may be divided into N-type and P-type transistors according to their characteristics. Embodiments of the present disclosure are described by taking the transistors all adopting P-type transistors as an example. Based on the description and teachings of the present disclosure, those of ordinary skill in the art may easily understand that at least some of the transistors in the pixel circuit structure according to embodiments of the present disclosure are N-type transistors, that is, N-type transistors or a combination of N-type transistors and P-type transistors. Therefore, these implementations are also within the protection scope of embodiments of the present disclosure.

Of course, in other embodiments of the present disclosure, the pixel circuit 10 may also adopt other structures, as long as the light-emitting device 30 can be driven to emit light, and the structure thereof is not limited herein.

All of the pixel circuits may be located in the display area 1021 of the non-light transmissive area 102, but not limited to this. Some pixel circuits may also be located in the non-display area 1022 of the non-light transmissive area 102 and used to connect with the light-emitting device 30 in the light transmissive area 101. Others pixel circuits may be located in the display area 1021 of the non-light transmissive area 102, for connecting with the light-emitting device 30 in the display area 1021 of the non-light transmissive area 102.

The assemble layer 2 may be formed on the base substrate 1, and the assemble layer 2 may include a plurality of mutually insulated lead layers. The adjacent lead layers may be separated by an insulation layer 22, and the insulation layer 22 may be an organic layer, or an inorganic layer, but it is not limited to this. The insulation layer 22 may include only one lead layer. Each lead layer may include a plurality of mutually insulated leads 211. The leads 211 are mainly used to realize the connection between the pixel circuit in the non-light transmissive area 102 and the anode of the light-emitting device 30 in the light transmissive area 101 mentioned later.

It should be noted that some of the leads 211 mentioned in embodiments of the present disclosure may be a whole lead 211 for realizing the connection between the pixel circuit and the anode. A part of this whole lead 211 may be located in the light transmissive area 101, and another part thereof may be located in the non-light transmissive area 102. Other leads 211 mentioned in embodiments of the present disclosure may be partial segments of a whole lead 211 used to realize the connection between the pixel circuit and the anode. A part of the partial segments may be located in the light transmissive area 101, and another part of the partial segment may be located in the non-light transmissive area 102.

The light-emitting layer 3 is formed on the side of the assemble layer 2 away from the base substrate 1, and the light-emitting layer 3 may include a plurality of light-emitting devices 30. A part of the light-emitting devices 30 may be located in the light transmissive area 101, and the other part of the light-emitting devices 30 may be located in the non-light transmissive area 102. The light-emitting device 30 in an embodiment of the present disclosure may be an OLED light-emitting device, which may include an anode 301, an organic light-emitting material layer 302 and a cathode 303. The anode 301 is located on the side of the organic light-emitting material layer 302 close to the assemble layer 2, and the cathode 303 is located on the side of the organic light-emitting material layer 302 away from the assemble layer 2.

The anode 301 of the light-emitting device 30 located in the light transmissive area 101 may be connected to a part of the pixel circuit located in the non-light transmissive area 102 through the lead 211 of the lead layer, and the anode 301 of the light-emitting device 30 located in the non-light transmissive area 102 may be connected to another part of the pixel circuit located in the non-light transmissive area 102.

Figure 6:
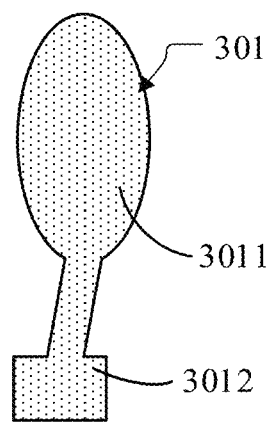
FIG. 6 shows a schematic top view of an anode according to an embodiment of the present disclosure.

Specifically, as shown in FIG. 5 and FIG. 6, the anode 301 may have an electrode part 3011 and a wiring part 3012 connected to each other. The electrode part 3011 is a part of the anode 301 that is in contact with the organic light-emitting material layer 302, and the wiring part 3012 is a part of the anode 301 that is connected to the lead 211 through the assemble hole 23 in the assemble layer 2.

In addition, in order to facilitate the definition of the light-emitting range of each light-emitting device 30, as shown in FIG. 5, the light-emitting layer 3 may further include a pixel definition layer 31, which may be provided on the surface of the assemble layer 2 away from the base substrate 1, and has openings exposing the anode 301. The organic light-emitting material layer 302 may cover the anode 301 in each opening, and expose the electrode part 3011. The wiring part 3012 is located outside the opening.

The structure of the display panel according to an embodiment of the present disclosure will be described in detail below.

Figure 7:
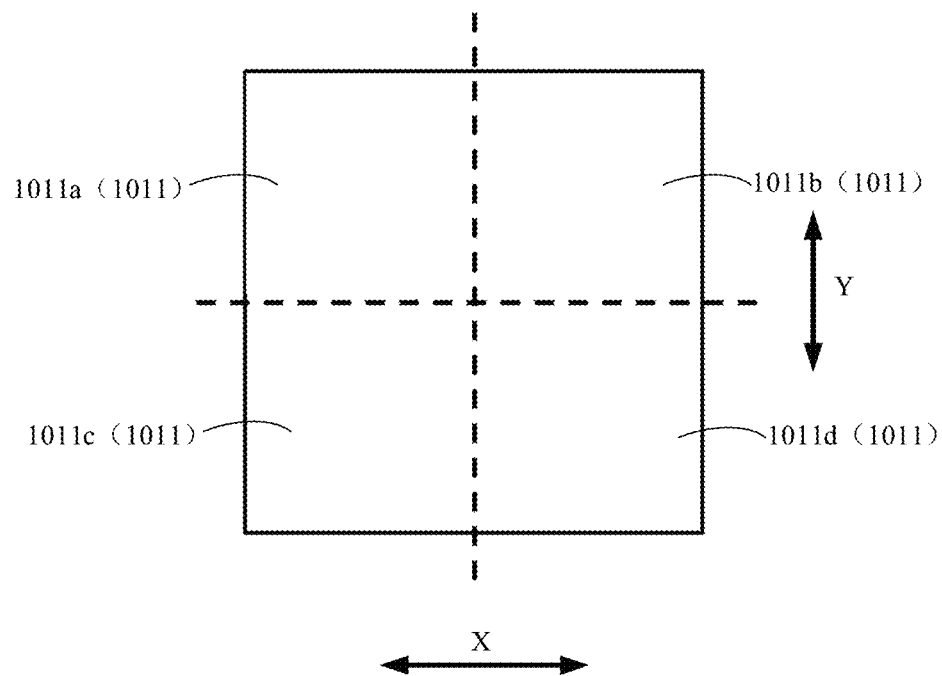
FIG. 7 shows a schematic distribution diagram of the light transmissive area according to an embodiment of the present disclosure.
Figure 8:
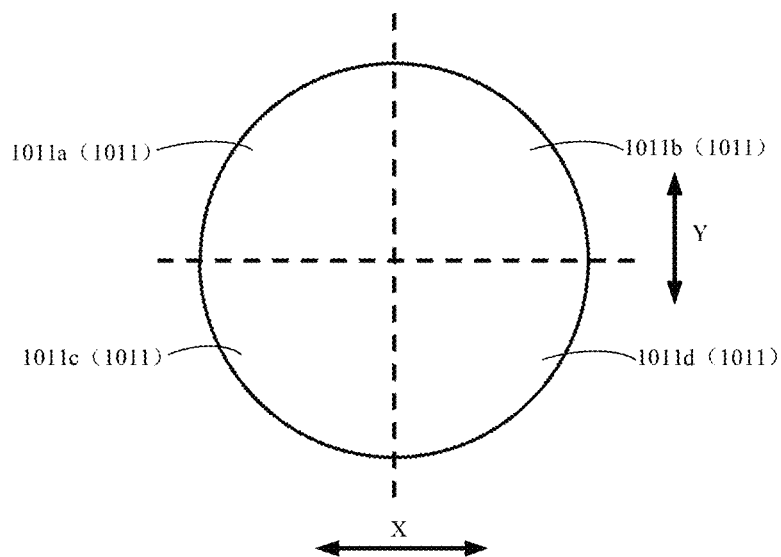
FIG. 8 shows a schematic distribution diagram of the light transmissive area according to another embodiment of the present disclosure.

In an embodiment of the present disclosure, as shown in FIG. 7 and FIG. 8, the light transmissive area 101 of the base substrate 1 may be divided into four transparent display areas 1011, and the four transparent display areas 1011 are arranged in array along the row direction X and the column direction Y. Two adjacent transparent display areas 1011 in the row direction X may be symmetrically arranged with respect to the column direction Y, but are not limited to this. Two adjacent transparent display areas 1011 in the column direction Y may be symmetrically arranged with respect to the row direction X, but not limited thereto, and may also be arranged asymmetrically.

For example, the four transparent display areas 1011 may be respectively defined as a first transparent display area 1011a, a second transparent display area 1011b, a third transparent display area 1011c and a fourth transparent display area 1011d. The first transparent display area 1011a and the second transparent display area 1011b are sequentially arranged in the row direction X and symmetrically arranged with respect to the column direction Y. The third transparent display area 1011c and the fourth transparent display area 1011d are sequentially arranged in the row direction X and symmetrically arranged with respect to the column direction Y. The first transparent display area 1011*a* and the third transparent display area 1011*c* are arranged in sequence in the column direction Y and arranged symmetrically with respect to the row direction X. The second transparent display area 1011*b* and the fourth transparent display area 1011*d* are arranged in sequence in the column direction Y and arranged symmetrically with respect to the row direction X.

The overall shape of the light transmissive area 101 in an embodiment of the present disclosure may be a rectangle. As shown in FIG. 7, when the overall shape of the light transmissive area 101 is a rectangle, each transparent display area 1011 may also be a rectangle, but not limited thereto. Therefore, the whole light transmissive area 101 may also be a circle or approximately a circle. As shown in FIG. 8, when the overall shape of the light transmissive area 101 is circular or approximately circular, each transparent display area 1011 may be a quarter circle or approximately a quarter circle.

It should be understood that the shape of the light transmissive area 101 is not limited to the aforementioned rectangular, circular, approximately circular and other shapes, and may also be other shapes, depending on the specific situations.

Figure 9:
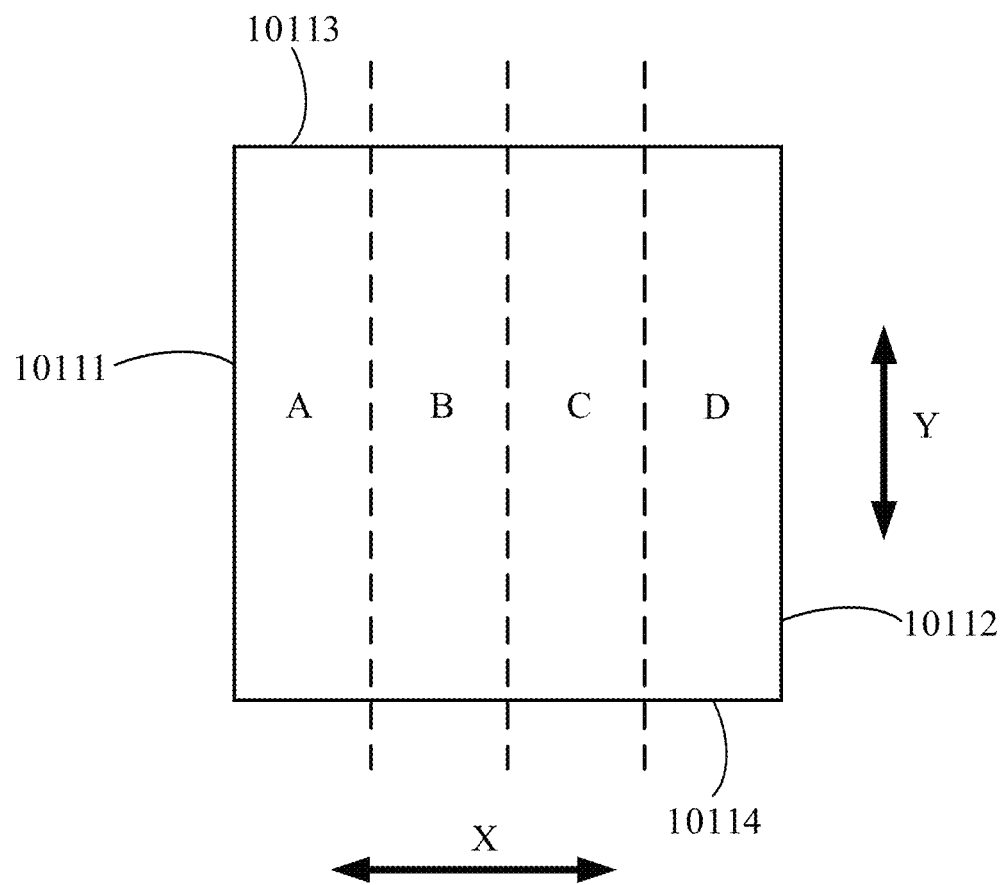
FIG. 9 shows a schematic distribution diagram of the first transparent display area in the light transmissive area shown in FIG. 7.
Figure 10:
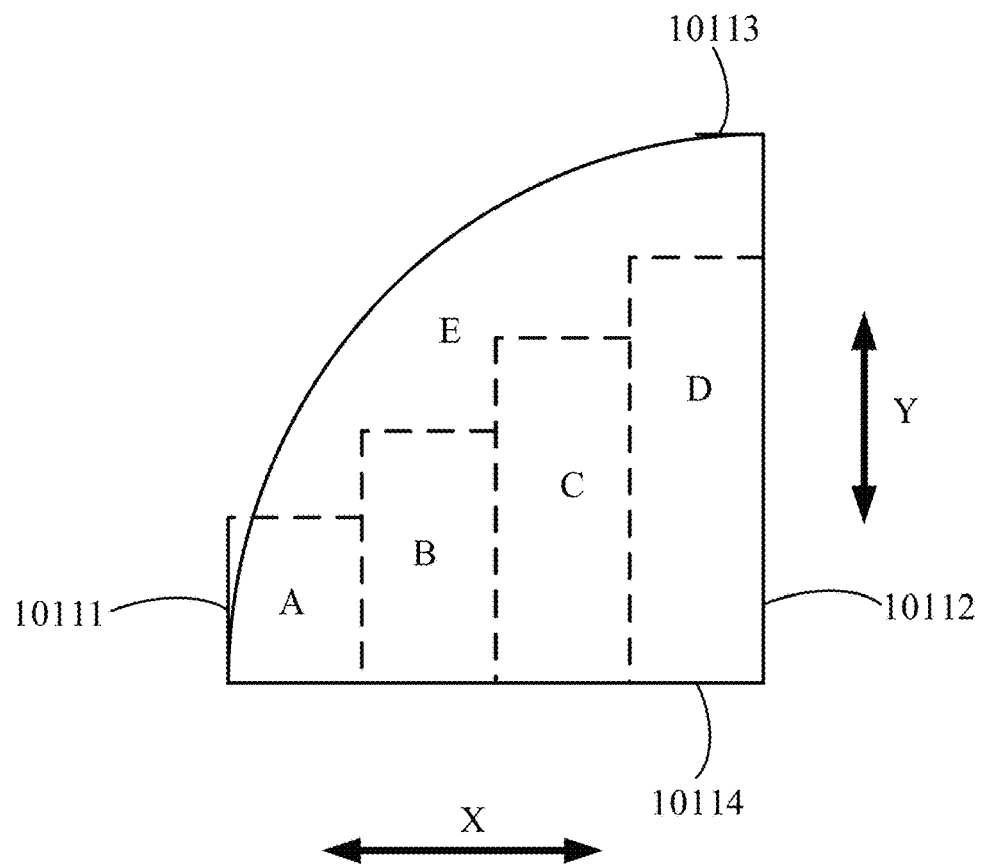
FIG. 10 shows a schematic distribution diagram of the first transparent display area in the light transmissive area shown in FIG. 8.

As shown in FIGS. 9 and 10, the transparent display area 1011 of the array substrate according to an embodiment of the present disclosure may have a first boundary 10111 and a second boundary 10112 being opposite in the row direction X, and a third boundary 10113 and a fourth boundary 10114 being opposite in the column direction Y. It should be noted that the transparent display area 1011 has a first boundary 10111, a second boundary 10112, a third boundary 10113 and a fourth boundary 10114, which does not mean that the transparent display area 1011 must be a rectangle. It may be a rectangle or other shapes, such as approximately a quarter circle, etc. Here, the transparent display area 1011 is defined to have a first boundary 10111, a second boundary 10112, a third boundary 10113 and a fourth boundary 10114, which is merely for the purpose of illustrating the positional relationship between structures such as the lead 211 and the anode 301 later for the sake of convenience.

For example, the transparent display area 1011 may include at least one section, and each section may include multiple rows of sub-areas arranged in the column direction Y. When dividing each section, the area occupied by each row of pixel units may be used for the division. That is, the area occupied by each row of pixel units may be sub-area, and the pixel unit includes a light-emitting device 30 and an assemble hole 23 correspondingly connected to the light-emitting device 30. Specifically, the sub-area may include a row of pixel areas and a row of assemble areas arranged in sequence in the column direction Y. When dividing each sub-area, the organic light-emitting material layers 302 and the assemble holes of the light-emitting devices 30 in each row may be used for the division. That is, the area occupied by the organic light-emitting material layer 302 of each row of light-emitting devices 30 is the pixel area (i.e., it may be understood as the light-emitting area). The area where the electrode part 3011 in the anode 301 is connected to the organic light-emitting material layer 302 may be the specific light-emitting area of each light-emitting device 30. The area occupied by the assemble holes 23 corresponding to each row of light-emitting devices 30 is the assemble area. That is, the assemble area is provided with the assemble hole 23.

Among the plurality of leads 211 located in the light transmissive area 101, some leads 211 may be only located in the pixel area; and other leads 211 include both the part located in the pixel area and the part located in the assemble area. In the anode 301, at least part of the electrode part 3011 is located in the pixel area, and at least part of the wiring part 3012 is located in the assemble area and connected to the part of the lead 211 in the assemble area through an assemble hole 23.

For example, the plurality of light-emitting devices 30 located in the light transmissive area 101 according to an embodiment of the present disclosure may include a plurality of light-emitting device groups. Each light-emitting device group includes four light-emitting devices 30, which are respectively a first light-emitting device, a second light-emitting device, a third light-emitting device and a fourth light-emitting device. The first light-emitting device, the second light-emitting device and the third light-emitting device correspond to different light-emitting colors. The light-emitting color corresponding to the fourth light-emitting device is the same as the light-emitting color corresponding to the second light-emitting device. For example, the light-emitting color corresponding to the first light-emitting device may be red, the light-emitting colors corresponding to the second light-emitting device and the fourth light-emitting device may be both green, and the light-emitting color corresponding to the third light-emitting device may be blue, but not limited to this. Other colors may also apply.

It should be understood that each light-emitting device 30 corresponds to an anode 301. In other words, in an embodiment of the present disclosure, an anode layer may be included, and the anode layer may include a group of anodes 301. Each group of anode 301 may include a first anode 301*a*, a second anode, a third anode 301*c* and a fourth anode 301*d*. The second anode 301*b* and the fourth anode 301*d* have the same light-emitting color. The first anode 301*a*, the second anode 301*b* and the third anode 301*c* have different light-emitting colors.

For example, when the light-emitting color corresponding to the first anode 301*a* is red, the light-emitting colors corresponding to the second anode 301*b* and the fourth anode 301*d* are both green, and the light-emitting color corresponding to the third anode 301*c* is blue, the electrode part 3011 of the first anode 301*a* may be elliptical, and the long axis thereof may extend in the column direction Y. The electrode parts 3011 of the second anode 301*b*, the third anode 301*c*, and the fourth anode 301*d* may all be circular. The areas of the electrode parts 3011 of the second anode 301*b* and the fourth anode 301*d* are equal to each other, and are smaller than the area of the electrode part 3011 of the third anode 301*c* and the area of the electrode part 3011 of the first anode 301*a*. The area of the electrode part 3011 of the first anode 301*a* is smaller than the area of the electrode part 3011 of the third anode 301*c*.

For example, in an embodiment of the present disclosure, the assemble area of the sub-area may be provided with a plurality of assemble hole groups arranged at intervals in the row direction X. Each assemble hole group may include four assemble holes 23 arranged at intervals in the row direction X, which are respectively defined as a first assemble hole 23*a* correspondingly connected with the first anode 301*a*, a second assemble hole 23*b* correspondingly connected with the second anode 301*b*, a third assemble hole 23*c* correspondingly connected with the third anode 301*c*, and a fourth assemble hole 23*d* correspondingly connected with the fourth anode 301*d*.

In the group of anodes 301, the wiring parts 3012 in the first anode 301*a*, the second anode 301*b*, the third anode 301c and the fourth anode 301d are in one-to-one correspondence with the assemble holes 23 in the same assemble area. At least 30% of the electrode parts 3011 in the first anode 301a, the second anode 301b and the third anode 301c are located in the pixel area of the same row of sub-areas. For example, in the pixel area of the m-th row of sub-areas, at least 30% of the electrode part 3011 of the fourth anode 301d is located in the pixel area of the adjacent row of sub-areas, for example, in the pixel area of the (m+1)-th row of sub-areas. It should be noted that m as mentioned here is a positive integer greater than or equal to 1.

In the assemble hole group, the first assemble hole 23a, the second assemble hole 23b, the third assemble hole 23c and the fourth assemble hole 23d are sequentially arranged in the row direction X, or the third assemble hole 23c, the fourth assemble hole 23d, the first assemble hole 23a and the second assemble hole 23b are arranged in sequence in the row direction X. Among two adjacent assemble hole groups in the column direction Y, the first assemble hole 23a of one assemble hole group and the third assemble hole 23c of the other assemble hole group are located in the same column in the column direction Y, that is, roughly located in the same display-only row, or slightly offset; and the second assemble hole 23b of one assemble hole group is located in the same column as the fourth assemble hole 23d of the other assemble hole group, that is, roughly located in the same display-only row, or slightly offset. It should be noted that the arrangement of the anodes 301 of each light-emitting device 30 in the light-emitting device group may be matched with the arrangement of each assemble hole 23 in the corresponding assemble hole group.

In some embodiments of the present disclosure, as shown in FIG. 9, at least one section of the transparent display area 1011 in the array substrate may include a first section A, a second section B, a third section C, and a fourth section D. The second section B is located at a side of the first section A close to the second boundary 10112. The third section C is located at a side of the second section B away from the first section A. The fourth section D is located at a side of the third section C away from the second section B. The first section A, the second section B, the third section C and the fourth section D may be rectangular or similar rectangular areas, and the sizes may be equal or unequal, depending on the specific situations.

It should be noted that the first section A, the second section B, the third section C, and the fourth section D may or may not be equally spaced. The first section A, second section B, the third section C and the fourth section D may be connected in sequence, but not limited to this. Any two adjacent sections among the first section A, the second section B, the third section C and the fourth section D may also be provided with an extra section, and the structure of this extra section is not specified here.

In addition, it should be understood that when the transparent display area 1011 is a quarter semicircle or similar to a quarter semicircle, as shown in FIG. 10, the transparent display area 1011 according to an embodiment of the present disclosure is not limited to include the aforementioned four sections, and it may also include a fifth section E. The fifth section E may be located at a side of the first section A, the second section B, the third section C and the fourth section D close to the third boundary 10113. In the fifth section E, the boundary adjoining the non-light transmissive area 102 may resemble a circular arc.

The following mainly describes the positional relationship between the light emitting device 30 and the lead 211 in each section of the transparent display area 1021 from the perspective of the anode 301.

With reference to FIGS. 9 to 14, in the pixel area of the sub-area of the first section A, a fourth anode 301d is mainly disposed in the area whose centerline is close to the third boundary 10113, and the first anode 301a, the second anode 301b and the third anode 301c are mainly arranged in the area whose centerline is far from the third boundary 10113. Therefore, it can be seen that in the pixel area of the sub-area of the first section A, the area of the anode 301, located in the area whose centerline is close to the third boundary 10113, is smaller than the area of the anode 301 in the area away from the third boundary 10113.

It should be noted that the center line of the pixel area mentioned above refers to the center line extending in the row direction X, and the distances between the center line and the assemble holes 23 of the assemble areas in two adjacent rows are equal.

In the sub-area of the first section A, the center line of the pixel area is separated by a first distance from the extension segment closest to the third boundary 10113 in the wiring group of the pixel area of the sub-area, and is separated by a second distance from the extension section farthest from the third boundary 10113. The first and second distances are dimensions in the column direction Y, and the first first and second distances are equal.

In the sub-area of the first section A, the number of leads 211 gradually decreases along the direction from the first boundary 10111 to the second boundary 10112 of the transparent display area 1011, and the size of the lead 211 in the row direction X gradually decreases along the direction from the third boundary 10113 to the fourth boundary 10114. That is to say, the corner areas close to the first boundary 10111 and the third boundary 10113 are areas where the leads 211 are denser, and the corner areas close to the second boundary 10112 and the fourth boundary 10114 are areas where the leads 211 are sparser.

Specifically, the assemble layer 2 may include a first assemble part located in the first section A, and the first assemble part includes a plurality of first wiring groups arranged in the column direction Y. Each of the first wiring groups corresponds to the sub-area of a first section A. The first wiring group includes a first lead 211a, a second lead 211b and a third lead 211c that are sequentially arranged along the direction from the base substrate 1 to the anode layer and insulated from each other. The first lead 211a includes a first extension segment 211aa extending in the row direction X. Part of the first lead 211a also includes a first lead-out segment 211ab extending in the column direction Y. The first extension segment 211aa is located in the pixel area of the sub-area. One end of the first lead-out segment 211ab is located in the pixel area of the sub-area and connected to an end of the first extension segment 211aa away from the first boundary 10111. The other end of the first lead-out segment 211ab is located in the assemble area of the sub-area and connected to the wiring part 3012 of an anode 301 through an assemble hole 23. The second lead 211b may include a second extension segment extending in the row direction X, and the second extension segment is located in the pixel area of the sub-area. The third lead 211c may include a third extension segment extending in the row direction X, and the third extension segment is located in the pixel area of the sub-area.

It should be noted that, the first lead 211a in an embodiment of the present disclosure may be a whole lead 211 mentioned above. The whole lead 211 may not only include the first extension segment 211aa and the first lead-out segment 211ab in the transparent display area 1011, but also include the partial structure located in the non-light transmissive area 102. The second lead 211b and the third lead 211c may be the partial straight segments of the whole lead 211 in the first section A, which extend in the row direction X as a whole. That is, the second lead 211 includes only the second extension segment, and the third lead 211 includes only the third extension segment.

Figure 12:
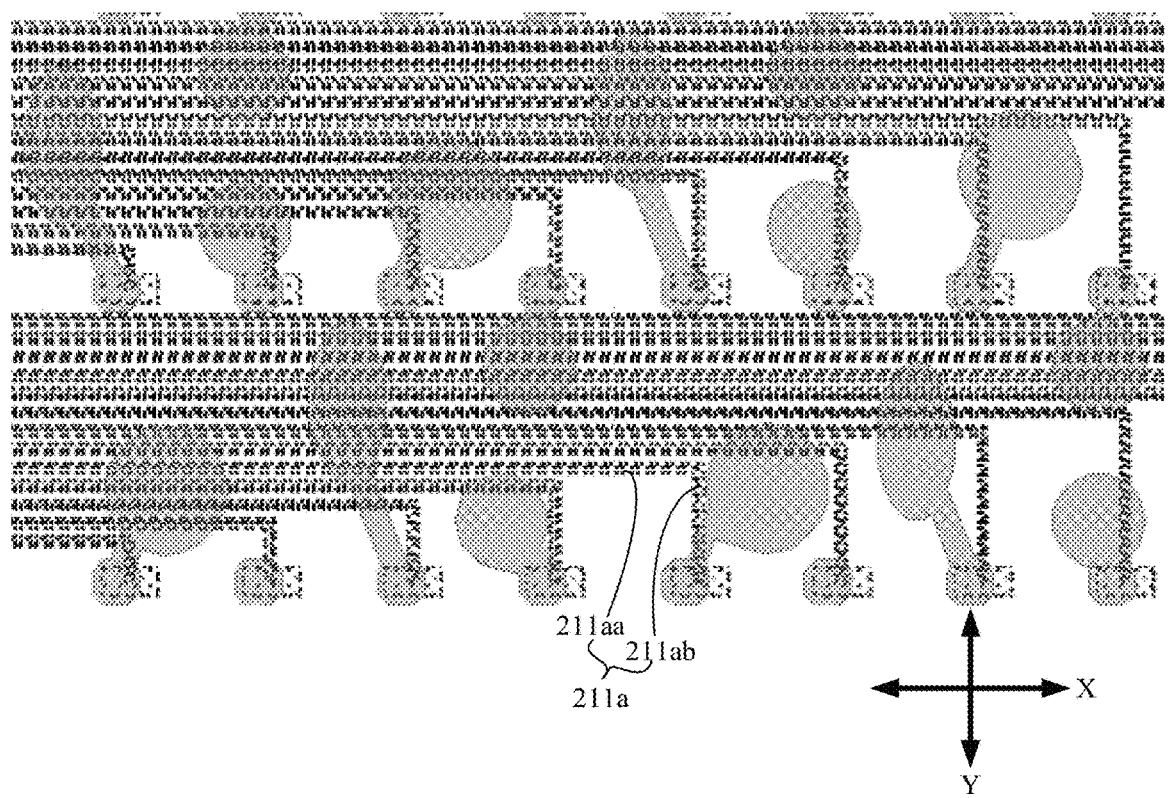
FIG. 12 shows a schematic diagram of the positional relationship between the anode and the first wiring in the structure shown in FIG. 11.
Figure 13:
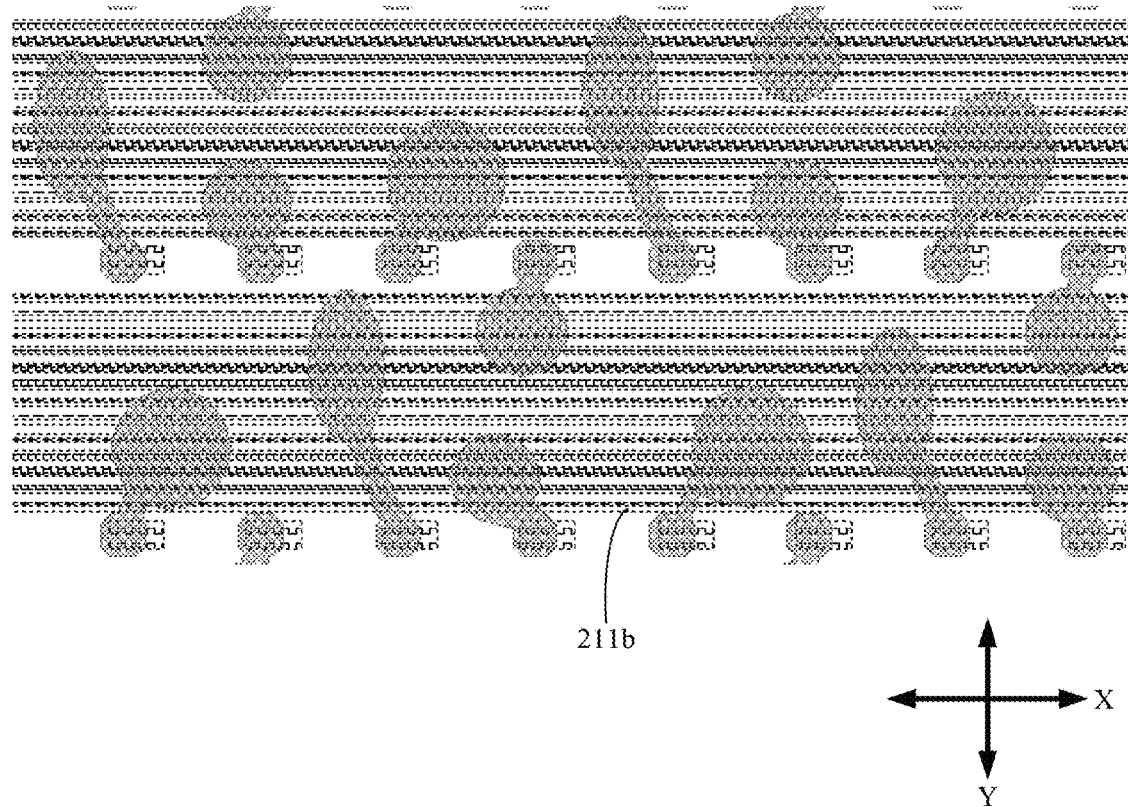
FIG. 13 shows a schematic diagram of the positional relationship between the anode and the second wiring in the structure shown in FIG. 11.
Figure 14:
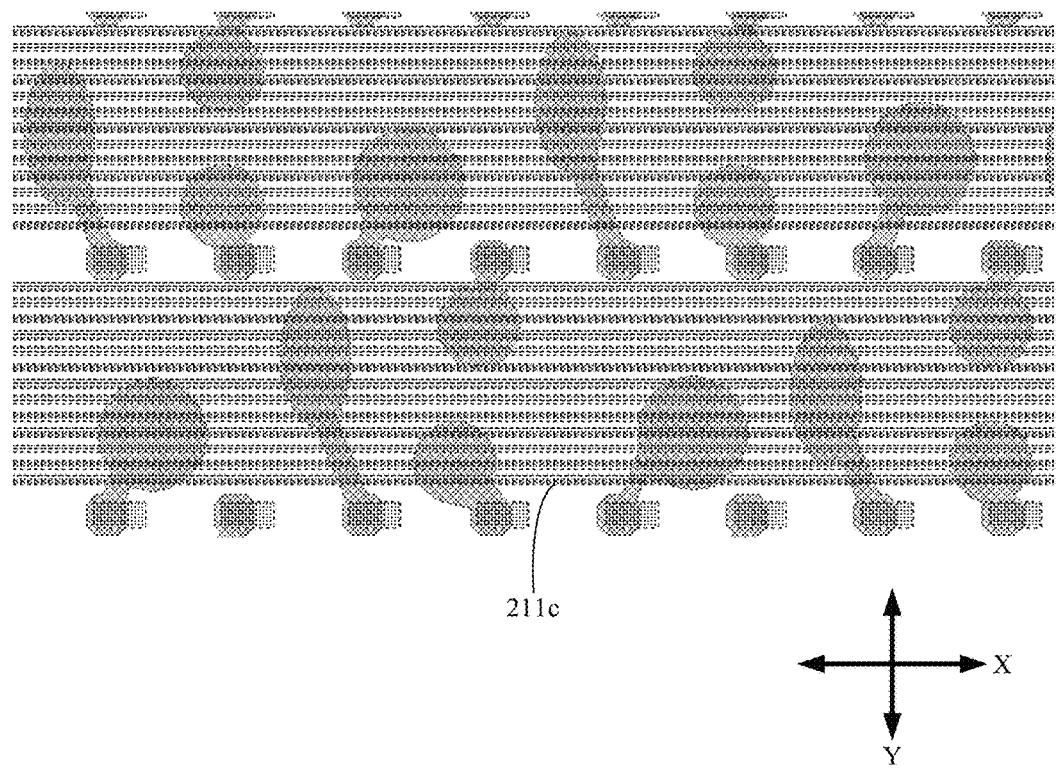
FIG. 14 shows a schematic diagram of the positional relationship between the anode and the third wiring in the structure shown in FIG. 11.

As shown in FIG. 12, among a part of the first leads 211a in the sub-area of the first section A close to the fourth boundary 10114: along the direction from the first boundary 10111 to the second boundary 10112, the number of the first extension segments 211aa gradually decreases, and the length of the first lead-out segment 211ab gradually increases; and along the direction from the third boundary 10113 to the fourth boundary 10114, the length of the first extension segment 211aa gradually decreases. As shown in FIG. 13 and FIG. 14. along the direction from the first boundary 10111 to the second boundary 10112, the numbers of the second extension segments and the third extension segments remain unchanged.

Figure 15:
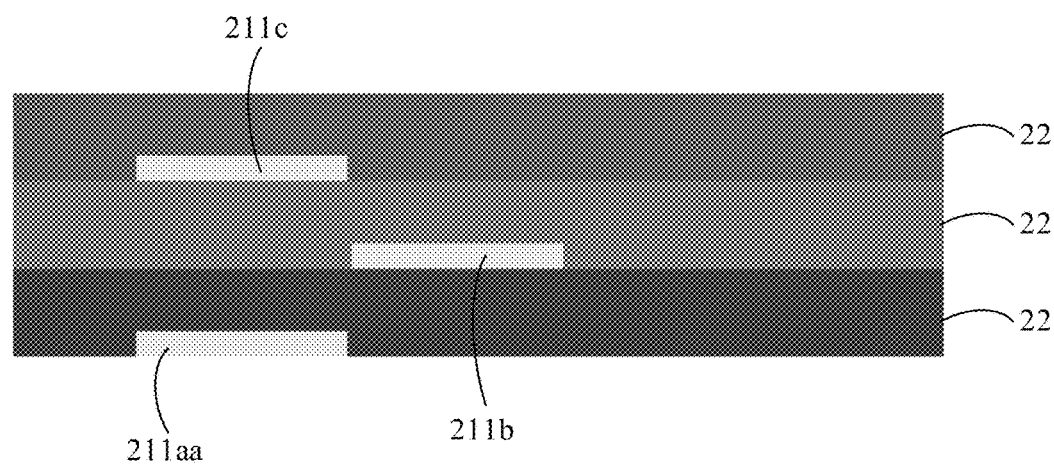
FIG. 15 shows a schematic cross-sectional view of the first extension segment, the second extension segment and the third extension segment according to an embodiment of the present disclosure.

In the sub-area of the first section A, the overlapping area on the base substrate 1 between at least one of the first extension segments 211aa and the third extension segment (i.e., the third lead 211c) is larger than that on the base substrate 1 between the at least one of the first extension segments 211aa and the second extension segment (i.e., the second lead 211b). For example, as shown in FIG. 15, in the sub-area of the first section A, the orthographic projections on the base substrate of the first extension segment 211aa and the third extension segment overlap with each other; and the orthographic projections on the base substrate of the first extension segment 211aa and the second extension segment do not overlap with each other. This design helps to appropriately reduce the space occupied by the first wiring group while ensuring the convenient wiring.

In the sub-area of the first section A, the plurality of first anodes 301a may include the first reference anode 301ab (the first anode 301a at positions ① and ⑧ shown in FIG. 11) and the first offset anode 301aa (the first anode 301a at positions ③ and ⑤ shown in FIG. 11) arranged at intervals in the row direction X. The center of the electrode part 3011 of the first offset anode 301aa is closer to the third boundary 10113 as compared to the center of the electrode part 3011 of the first reference anode 301ab. That is to say, the centers of the electrode parts 3011 of at least two first anodes 301a disposed in the sub-area of the first section A are not located on the same straight line extending in the row direction X. That is, each of the first anodes 301a in the sub-area of the first section A may be arranged irregularly. Specifically, positions of the first anodes 301a may be adjusted according to the wiring density of each area in the sub-area of the first area A.

It can be seen from the foregoing that in the pixel area of the sub-area of the first section A, the density of the leads 211 in the area whose center line is close to the third boundary 10113 is greater than that of the leads 211 in the area away from the third boundary 10113, and the area of the first anode 301a in the area whose center line is close to the third boundary 10113 is smaller than the area of the anode 301 in the area away from the third boundary 10113. In order to ensure that the overlapping area between the first anode 301a and the lead 211 in these two areas is more balanced, part of the first anodes 301a may be moved toward the direction close to the third boundary 10113, so as to ensure that the overlap between each of the first anodes 301a and the wiring in the first section A is more balanced. Thereby, it can be ensured that the parasitic capacitances generated by each of the first anodes 301a and the wiring in the first section A is close to each other, so as to avoid the situation where the parasitic capacitances of the first anodes 301a are too different to affect the pixel current. Then, the mura phenomenon in the light transmissive area 101 can be improved.

It should be noted that, in an embodiment of the present disclosure, when designing the structure in the first section A, positions of some of the first anodes 301a may be firstly designed, and these firstly designed first anodes 301a may be defined as the aforementioned first reference anodes 301ab. Then, according to the wiring density of each area, positions of other first anodes 301a are adjusted relative to positions of the first reference anodes 301ab that are designed in advance. These adjusted first anodes 301a may be defined as first offset anodes 301aa.

For example, the first section A may have N rows of sub-areas, where N is a positive integer greater than 1. As shown in FIG. 9 to FIG. 14, in the pixel area of the n-th row of sub-areas of the first section A, the offset anode 301aa may be located at a side of the first reference anode 301ab close to the second boundary 10112. In the pixel area of the (n+1)-th row of sub-areas of the first section A, the first offset anode 301aa is located at a side of the first reference anode 301ab close to the first boundary 10111. The first reference anode 301ab in the pixel area of the n-th row of sub-areas of the first section A is located at a side close to the first boundary 10111 of the first offset anode 301aa in the pixel area of the (n+1)-th row of sub-areas of the first section A. The first offset anode 301aa in the n-th row of sub-areas of the first area A is located between the first offset anode 301aa and the first reference anode 301ab in the pixel area of the (n+1)-th row of sub-areas of the first section A. It should be noted that 1≤n<N, where n is a positive integer. Optionally, in the sub-area of the first section A, the center of the electrode part 3011 of the first offset anode 301aa is located at a side close to the third boundary 10113 of the center line of the pixel area where it is located, so as to further ensure that the overlap between each of the first anodes 301a and the wiring in the first section A is more balanced. This helps to improve the mura phenomenon in the light transmissive area 101.

Further, in the sub-area of the first section A, an overlap exists between orthographic projections on the base substrate of the top end of the electrode part 3011 of at least part of the first offset anode 301aa and an extension segment closest to the third boundary 10113 among the first extension segment 211aa, the second extension segment and the third extension segment of the first wiring group. This design helps to reduce the design difficulty while ensuring a more balanced overlap between each of the first anodes 301a and the wiring.

It should be noted that the top end of the electrode part 3011 of the anode 301 as mentioned in an embodiment of the present disclosure is an end of the electrode part 3011 close to the third boundary 10113, and the bottom end of the electrode part 3011 of the anode 301 is an end of the electrode part 3011 away from the third boundary 10113.

For example, in the sub-area of the first section A, the center of the electrode part 3011 of at least one of the first reference anodes 301ab is located on the center line of the pixel area where it is located. This design is convenient to adjust the position of the first offset anode 301aa, so as to make the overlap between each of the first anodes 301a and the wiring in the first section A more balanced, but the present disclosure is not limited to this. The center of the electrode part 3011 of the first reference anode 301*ab* may also not be located on the center line of the pixel area.

Figure 11:
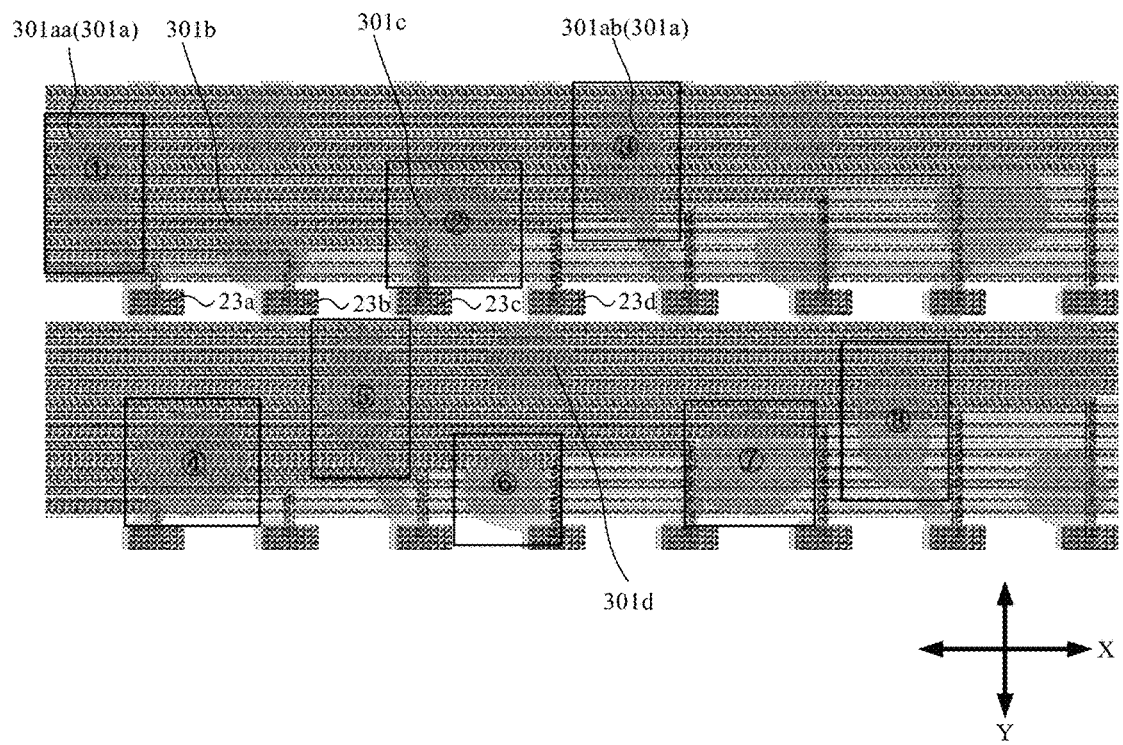
FIG. 11 is a schematic diagram showing at least partial structure of the first section of the first transparent display area shown in FIG. 9 or FIG. 10.

For example, in the first section A: as shown in FIG. 11 and FIG. 12, no overlap exists between orthographic projections on the base substrate 1 of the first lead-out segment 211*ab* and the electrode part 3011 of at least one of the second anodes 301*b* (the second anode 301*b* at the position ⑥ shown in FIG. 12); and an overlap exists between orthographic projections on the base substrate 1 of the first lead-out segment 211*ab* and the electrode part 3011 of at least one of the second anodes 301*b* (other second anodes 301*b* except for that at the position ⑥ shown in FIG. 12).

It should be noted that, in an embodiment of the present disclosure, when designing the structure in the first section A, positions of some of the second anodes 301*b* may be designed first, and these second anodes 301*b* designed first may be defined as the second reference anodes 301*b*. An overlap exists between orthographic projections on the base substrate of the first lead-out segment 211*ab* and the electrode part 3011 of the second reference anode 301*b*. Then, according to the wiring density of each area, positions of other second reference anodes 301 are adjusted relative to the positions of the second reference anodes 301 designed firstly. These adjusted second anodes 301*b* may be defined as the second offset anodes 301*b*. No overlap exists between the orthographic projections on the base substrate 1 of the electrode parts 3011 of the second offset anodes 301*b* and the first lead-out segment 211*ab*.

For example, in the first section A, an overlap exists between orthographic projections on the base substrate 1 of the bottom end of the electrode part 3011 of at least one of the third anodes 301*c* (the third anode 301*c* at positions ②, ④ and ⑦ shown in FIG. 12) and the extension segment farthest from the third boundary 10113 among the first extension segment 211*aa*, the second extension segment and the third extension segment of the first wiring group. The orthographic projection on the base substrate 1 of the electrode part 3011 of at least one of the third anodes 301*c* (the third anode 301*c* at positions ⑦ shown in FIG. 12) does not overlap with the orthographic projection on the base substrate 1 of the first lead-out segment 211*ab*.

For example, in the first section A, the orthographic projection on the base substrate 1 of the bottom end of the electrode part 3011 of at least one of the third anodes 301*c* (other third anodes 301*c* except for those at the positions ②, ④ and ⑦ shown in FIG. 12) does not overlap with the orthographic projection on the base substrate 1 of an extension segment farthest from the third boundary 10113 among the first extension segment 211*aa*, the second extension segment and the third extension segment of the first wiring group; and the orthographic projection on the base substrate 1 of the electrode part 3011 of at least one of the third anodes 301*c* overlaps with the orthographic projection on the base substrate 1 of the first lead-out segment 211*ab*.

It should be noted that, in an embodiment of the present disclosure, when designing the structure in the first section A, positions of some of the third anodes 301*c* may be designed first, and these third anodes 301*c* designed first may be defined as the third reference anode 301*c*. An overlap exists between the orthographic projections on the base substrate 1 of the electrode part 3011 of the third reference anode 301*c* and the first lead-out section 211*ab*. In the meanwhile, no overlap exists between the orthographic projections on the base substrate 1 of the electrode part 3011 of the third reference anode 301*c* and an extension segment farthest from the third boundary 10113 among the first extension segment 211*aa*, the second extension segment and the third extension segment of the first wiring group. Then, according to the wiring density of each area, positions of other third anodes 301*c* are adjusted relative to the positions of the third reference anodes 301 designed firstly. These adjusted third anodes 301*c* may be defined as third offset anodes 301*c*. No overlap exits between the orthographic projections on the base substrate 1 of the electrode parts 3011 of part of the third offset anodes 301*c* and the first lead-out segment 211*ab*. In the meanwhile, an overlap exits between the orthographic projections on the base substrate 1 of the electrode parts 3011 of part of the third offset anodes 301*c* and an extension segment farthest from the third boundary 10113 among the first extension segment 211*aa*, the second extension segment and the third extension segment of the first wiring group. An overlap exits between the orthographic projections on the base substrate 1 of the electrode parts 3011 of another part of the third offset anodes 301*c* and the first lead-out segment 211*ab*. In the meanwhile, no overlap exits between the orthographic projections on the base substrate 1 of the electrode parts 3011 of another part of the third offset anodes 301*c* and an extension segment farthest from the third boundary 10113 among the first extension segment 211*aa*, the second extension segment, and the third extension segment of the first wiring group.

For example, in the first section A, as shown in FIG. 12, the orthographic projections on the base substrate 1 of the electrode part 3011 of each of the fourth anodes 301*d* and the first lead-out segment 211*ab* do not overlap. In the meanwhile, the orthographic projections on the base substrate 1 of the top end of the electrode part 3011 of each of the fourth anodes 301*d* and an extension segment closest to the third boundary 10113 among the first extension segment 211*aa*, the second extension segment and the third extension segment of the first wiring group overlap with each other.

It should be noted that, when designing the structure in the first section A according to an embodiment of the present disclosure, the fourth anodes 301*d* may adopt the same design rule. That is, each of the fourth anodes 301*d* may be understood as a reference anode, and no offset design occurs.

The offset in the column direction Y of the electrode part 3011 of the aforementioned offset anode 301 compared with the electrode part 3011 of the corresponding reference anode 301 may be from 2 μm to 10 μm, for example, 2 μm, 4 μm, 6 μm, 8 μm, 10 μm, etc. The offset in the row direction X may be from 1 μm to 5 μm, such as 1 μm, 2 μm, 3 μm, 4 μm, 5 μm, etc. The specific value depends on the detailed design.

In addition, in the first section A, the width of the first extension segment 211*aa*, the width of the first lead-out segment 211*ab*, the width of the second extension segment, the width of the third extension segment, the distance between adjacent first extension segments 211*aa*, the distance between adjacent second extension segments, and the distance between adjacent third extension segments are all in the range from 1 μm to 3 μm, for example 1 μm, 1.5 μm, 2 μm, 2.5 μm, 3 μm and so on.

In the first section A, as shown in FIG. 11 to FIG. 14, the number of the first extension segments 211*aa*, the number of the second extension segments, and the number of the third extension segments covered by the electrode part 3011 of the first anode 301*a* may all be from 6 to 10. The number of the first extension sections 211*aa* covered by the electrode part 3011 of the second anode 301*b* may be from 0 to 5, and the number of the second extension segments and the number of the third extension segments covered at the same time may be from 4 to 6. The number of the first extension segments 211*aa* covered by the electrode part 3011 of the third anode 301*c* may be from 1 to 7. The number of the second extension segments and the number of the third extension segments covered at the same time may be from 6 to 8. The number of the first extension segments 211*aa*, the number of the second extension segments, and the number of the third extension segments covered by the electrode part 3011 of the fourth anode 301*d* may be from 5 to 7.

It should be noted that, in the first sub-area A, the number of the extension segments of the leads 211 covered by the electrode part 3011 of each anode 301 is not limited to the above-mentioned values, and the specific number is related to the width of the extension segment and the difference between adjacent extension segments.

In some embodiments of the present disclosure, as shown in FIG. 16 to FIG. 19, the assemble layer 2 may further include a second assemble part located in the second section B. The second assemble part may include a plurality of fourth leads 211*d* provided on the same layer as the first lead 211*a*, a plurality of fifth leads 211*e* provided on the same layer as the second lead 211*b*, and a plurality of sixth leads 211*f* provided on the same layer as the third lead 211*c*.

Figure 17:
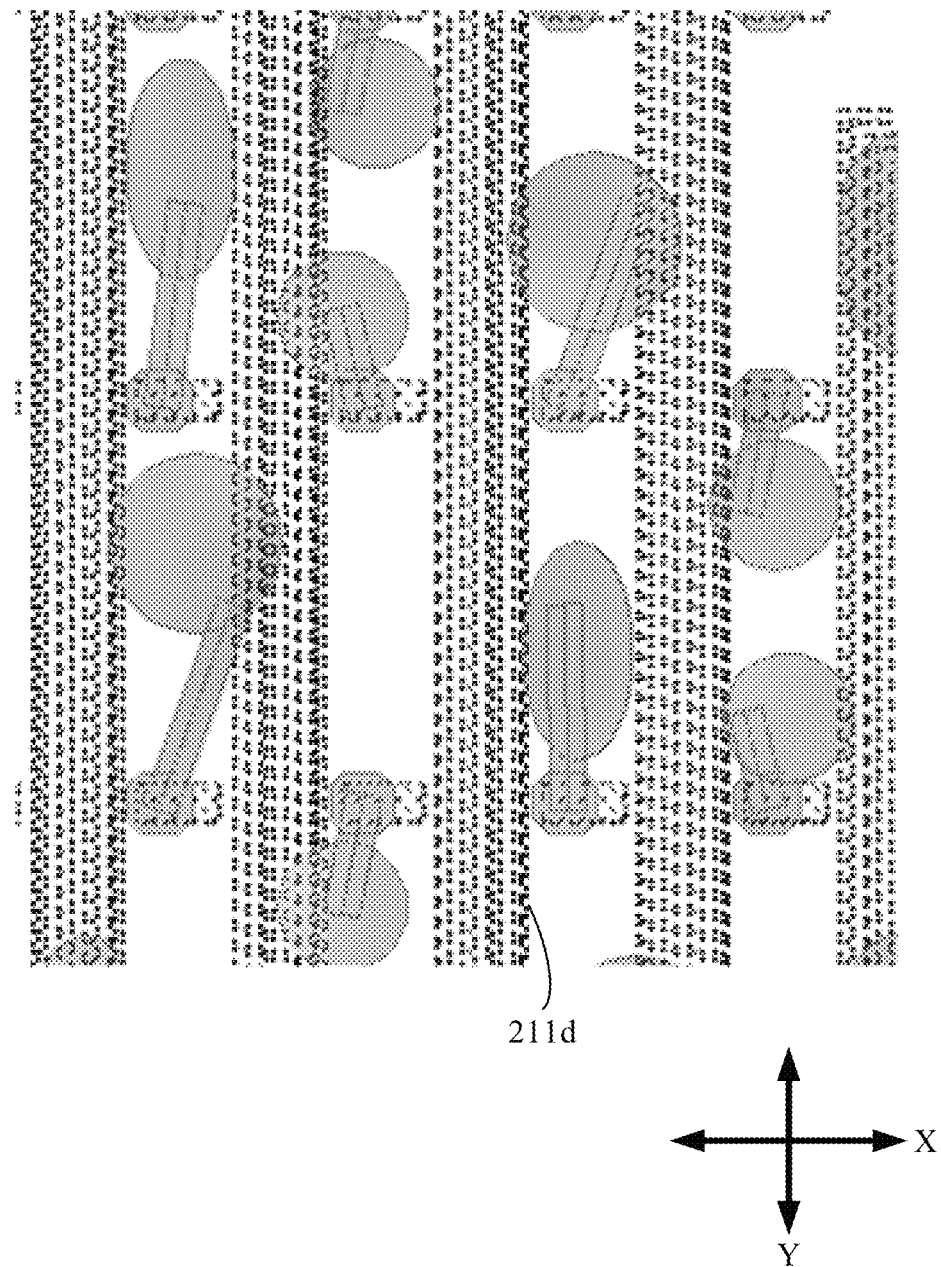
FIG. 17 shows a schematic diagram of the positional relationship between the anode and the fourth wiring in the structure shown in FIG. 16.
Figure 18:
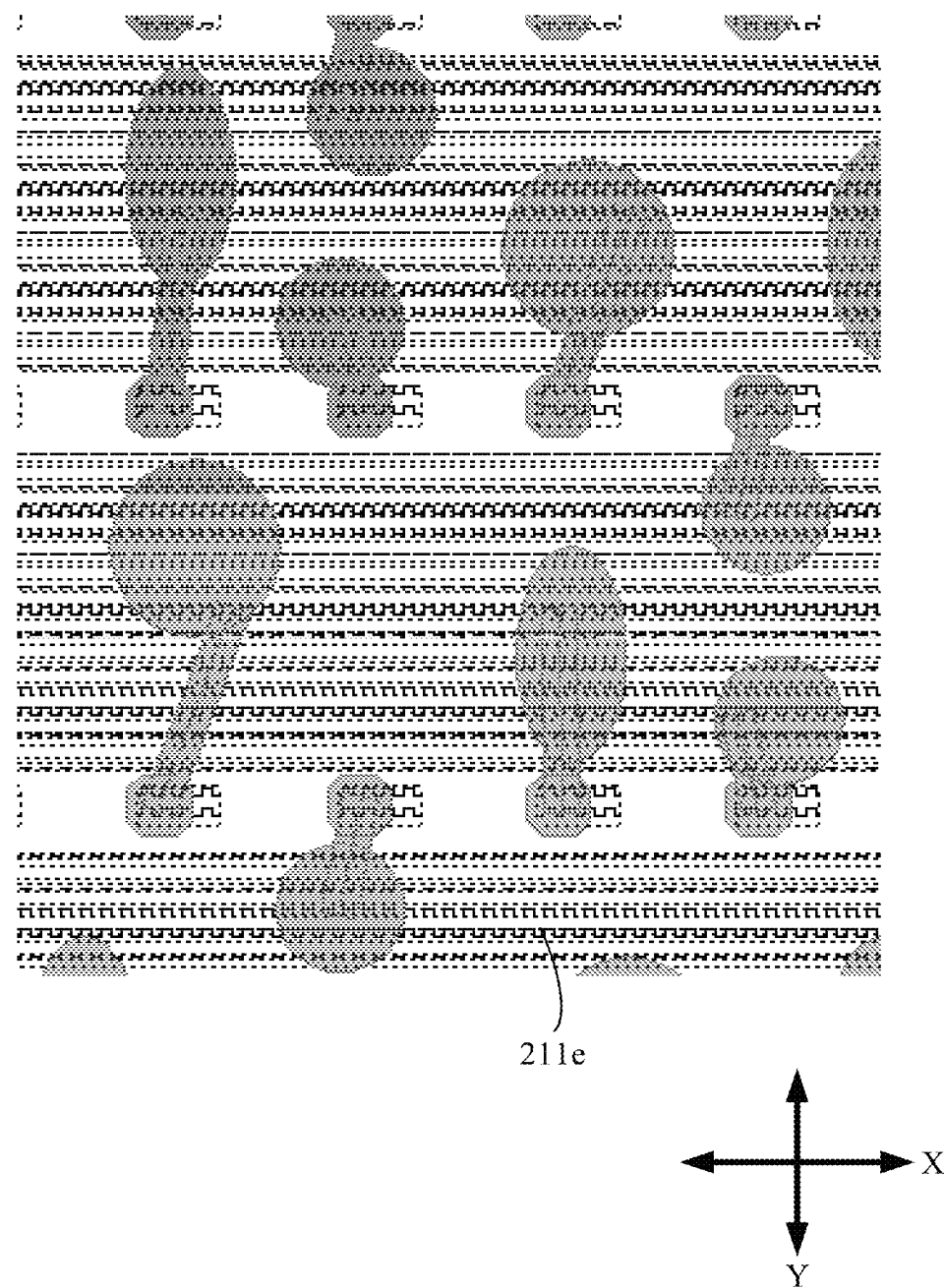
FIG. 18 is a schematic diagram showing the positional relationship between the anode and the fifth wiring in the structure shown in FIG. 16.
Figure 19:
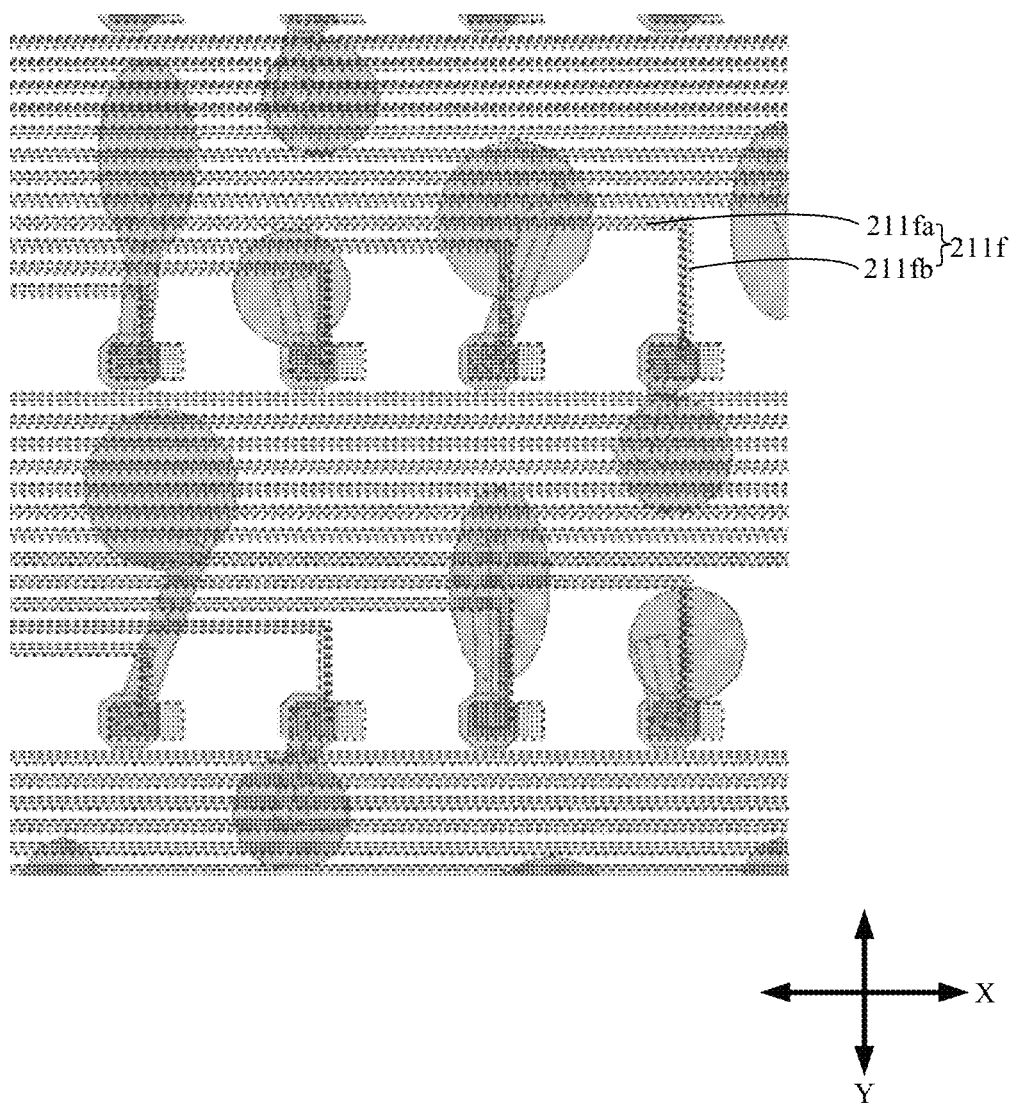
FIG. 19 shows a schematic diagram of the positional relationship between the anode and the sixth wiring in the structure shown in FIG. 16.

In the second section B, as shown in FIG. 17, each fourth lead 211*d* includes a fourth extension segment extending in the column direction Y. The orthographic projection on the base substrate 1 of the fourth extension segment is located in the pixel area and the assemble area of each section, and does not overlap with the orthographic projection on the base substrate 1 of the assemble hole 23. As shown in FIG. 18, each fifth lead 211*e* includes a fifth extension segment extending in the row direction X. The fifth extension segment is located in the pixel area of the sub-area. As shown in FIG. 19, each sixth lead 211*f* includes a sixth extension segment 211*fa* extending in the row direction X. The sixth extension segment 211*fa* is located in the pixel area of the sub-area. At least part of the sixth lead 211*f* further includes a sixth lead-out segment 211*fb* extending in the column direction Y. One end of the sixth lead-out segment 211*fb* is located in the pixel area of the sub-area and connected with an end of the sixth extension segment 211*fa* away from the first boundary 10111. The other end of the sixth lead-out segment 211*fb* is located in the assemble area of the sub-area and connected to the wiring part 3012 of an anode 301 through an assemble hole 23.

It should be noted that the fourth lead 211*d*, the fifth lead 211*e* and the sixth lead 211*f* in an embodiment of the present disclosure may be partial segments located in the second section B of the whole lead 211. The fourth lead 211*d*, the fifth lead 211*e* and the sixth lead 211*f* may be connected to the lead 211 provided on the same layer in other areas. For example, the fifth extension segment of the fifth lead 211*e* may be integrally connected and collinear with the second extension segment of the second lead 211*b*. The sixth extension segment 211*fa* of the sixth lead 211*f* may be integrally connected and collinear with the third extension segment of the third lead 211*c*.

In the sub-area of the second section B, as shown in FIG. 19, along the direction from the first boundary 10111 to the second boundary 10112, the length of the sixth lead-out segment 211*fb* may gradually increase.

For example, in the sub-area of the second section B, no overlap exists between the orthographic projections on the base substrate 1 of the center of the electrode part 3011 of at least one anode 301 and the fourth extension segment (i.e., the fourth lead 211*d*). For example, as shown in FIGS. 16 and 17, in the second section B, no overlap exists between the orthographic projections on the base substrate 1 of the center of the electrode part 3011 of each anode 301 and the fourth extension segment, see the anodes 301 at the positions ①②③④⑤⑥⑦⑧ shown in FIG. 16.

Figure 16:
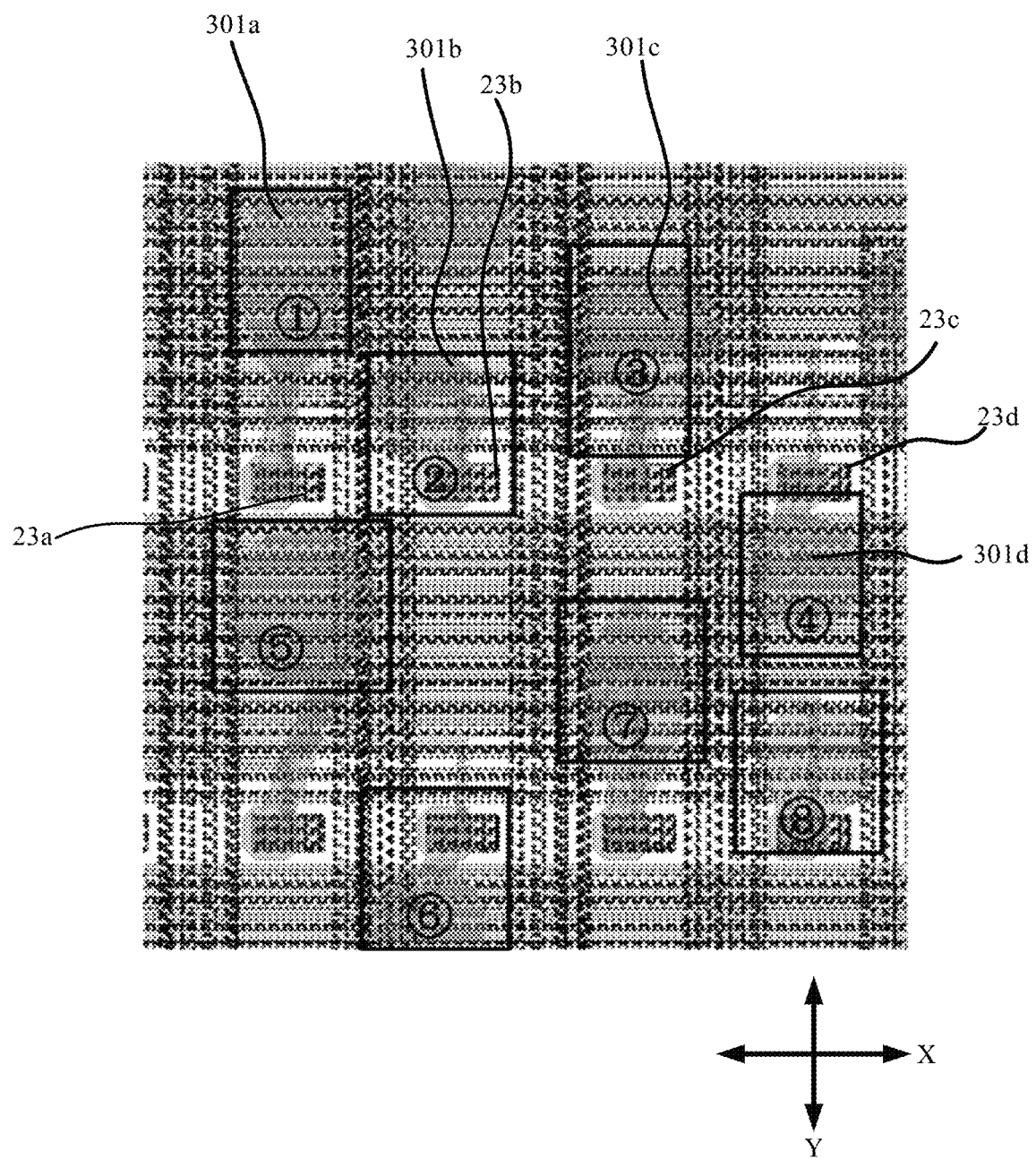
FIG. 16 is a schematic diagram showing at least partial structure of the second section of the first transparent display area shown in FIG. 9 or FIG. 10.

For example, in the sub-area of the second section B: as shown in FIGS. 16 and 17, no overlap exists between the orthographic projections on the base substrate 1 of the electrode part 3011 of at least one first anode 301*a* (the first anode 301*a* at the position ① shown in FIG. 16) and the fourth extension segment; as shown in FIG. 16 and FIG. 18, an overlap exists between the orthographic projections on the base substrate 1 of a bottom end of the electrode part 3011 of at least one first anode 301*a* (the first anode 301*a* at the position ⑦ shown in FIG. 16) and the fifth extension segment (i.e., the fifth lead 211*e*) closest to the fourth boundary 10114; as shown in FIG. 16 and FIG. 18, an overlap exists between the orthographic projections on the base substrate 1 of a top end of the electrode part 3011 of at least one first anode 301*a* (the first anode 301*c* at the position ⑤ shown in FIG. 16) and the fifth extension segment closest to the third boundary 10113.

In addition, in the second section B, the width of the fourth extension segment, the width of the fifth extension segment, the width of the sixth extension segment 211*fa*, the width of the sixth lead-out segment 211*fb*, the distance between adjacent fourth extension segments, the distance between adjacent fifth extension segments, and the distance between adjacent sixth extension segments 211*fa* are in the range from 1 μm to 3 μm, for example, 1 μm, 1.5 μm, 2 μm, 2.5 μm, 3 μm and so on.

It should be noted that the adjacent extension segments as mentioned in embodiments of the present disclosure refer to adjacent extension segments located between adjacent assemble holes 23.

In the second section B: as shown in FIG. 16 to FIG. 19, the number of the fourth extension segments covered by the electrode part 3011 of the first anode 301*a* is 0 or 1, and the numbers of the fifth extension segments and the sixth extension segments covered at the same time are both from 5 to 10. The number of the fourth extension segments covered by the electrode part 3011 of the second anode 301*b* may be from 1 to 3, and the number of the fifth extension segments and the number of the sixth extension segments 211*fa* covered at the same time may be from 4 to 6 and from 0 to 3 respectively; the number of the fourth extension segments covered by the electrode part 3011 of the third anode 301*c* may be from 2 to 4, and the number of the fifth extension segments and the number of the sixth extension segments 211*fa* covered at the same time may be from 6 to 8; the number of the fourth extension segments covered by the electrode part 3011 of the fourth anode 301*d* may be from 1 to 3, and the number of the fifth extension segments and the number of the sixth extension segments 211*fa* covered at the same time may be from 5 to 7.

It should be noted that, in the second section B, the number of the extension segments of the leads 211 covered by the electrode part 3011 of each anode 301 is not limited to the above-mentioned values, and the specific number is related to the width of the extension segment and the distance between the adjacent extension segments.

In some embodiments of the present disclosure, as shown in FIG. 20 to FIG. 23, the assemble layer 2 may further include a third assemble part located in the third section C. The third assemble part may include a plurality of seventh leads 211*g* provided on the same layer as the first lead 211*a*, a plurality of eighth leads 211*h* provided on the same layer as the second lead 211*b*, and a plurality of ninth leads 211*j* provided on the same layer as the third lead 211*c*.

Figure 21:
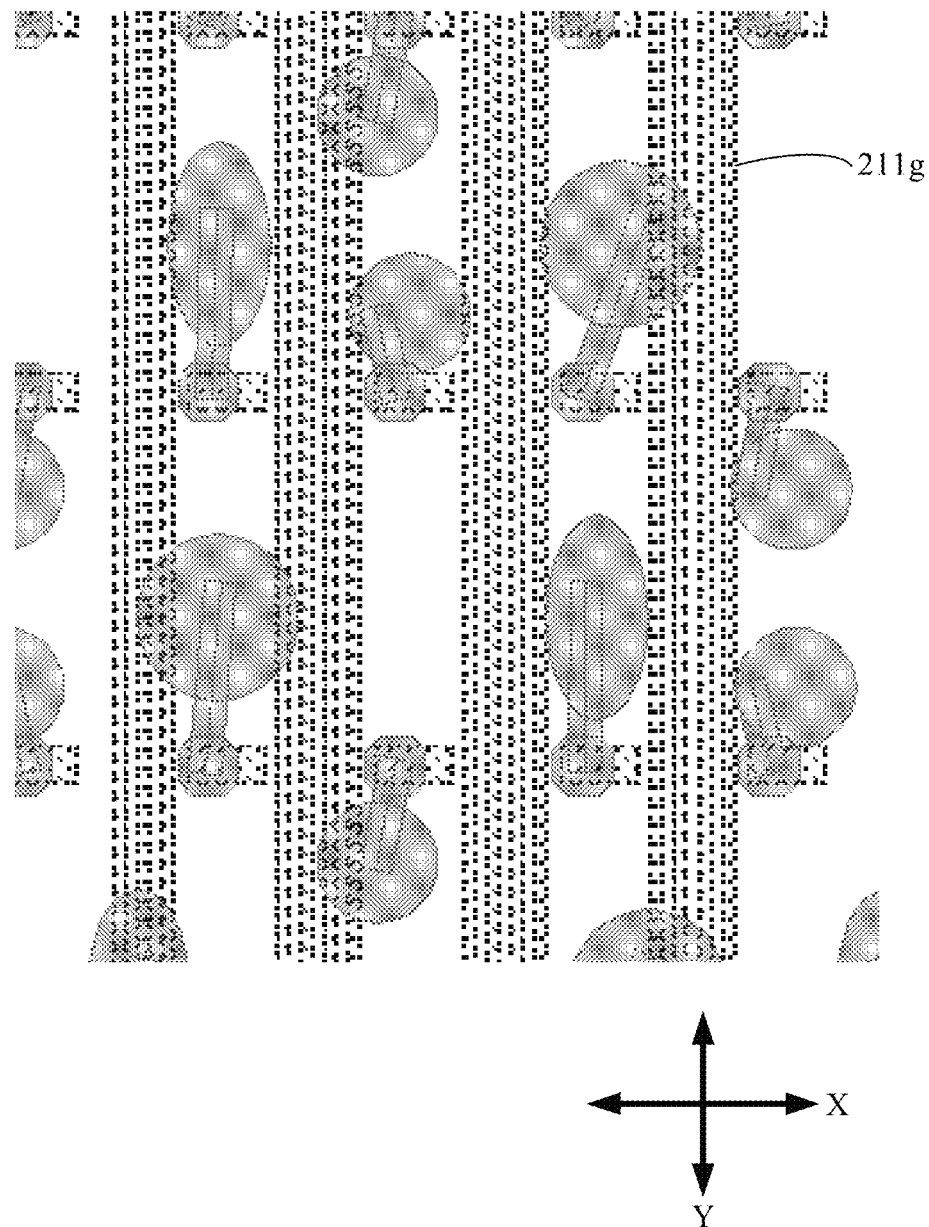
FIG. 21 shows a schematic diagram of the positional relationship between the anode and the seventh wiring in the structure shown in FIG. 20.
Figure 22:
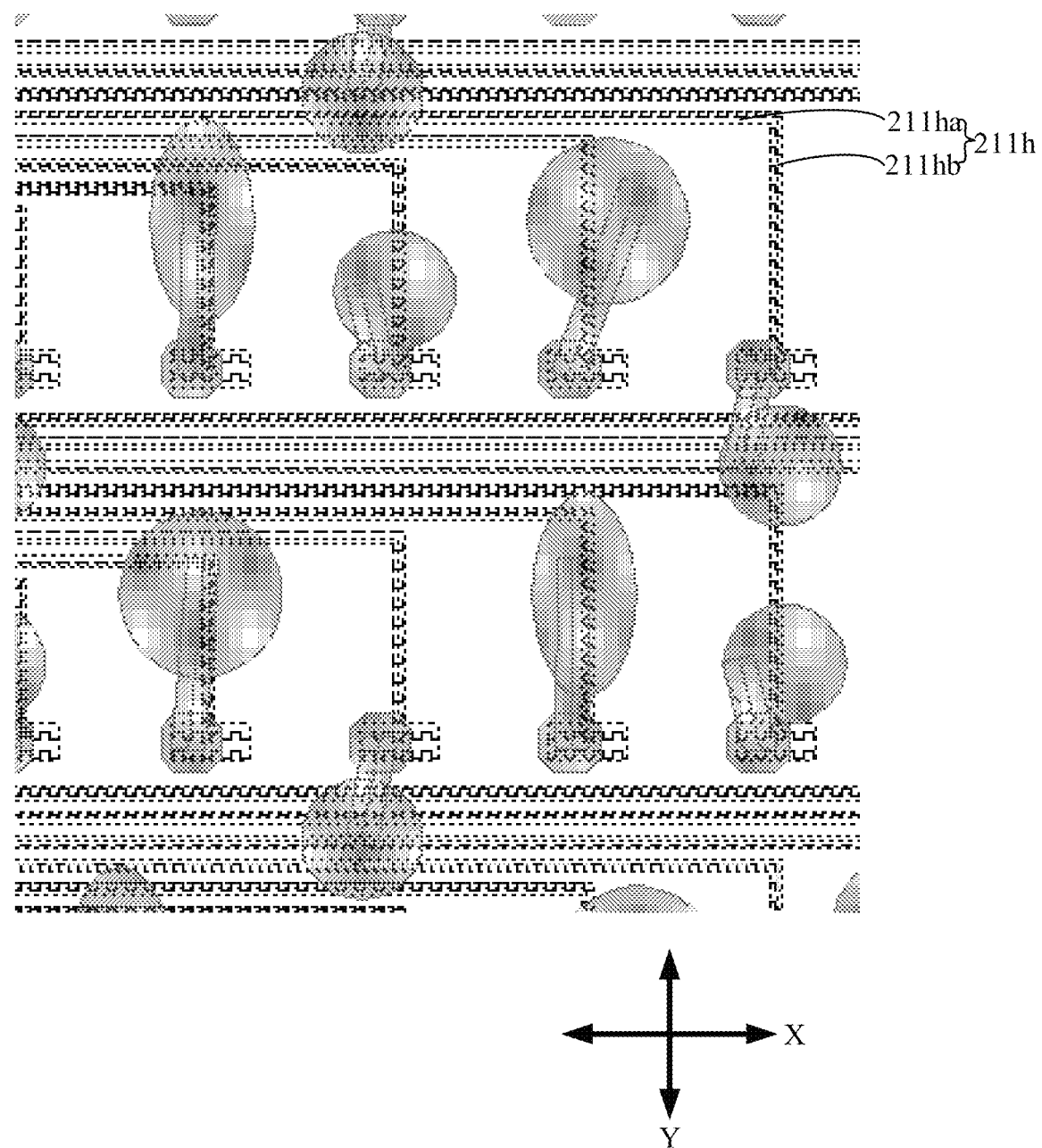
FIG. 22 shows a schematic diagram of the positional relationship between the anode and the eighth wiring in the structure shown in FIG. 20.
Figure 23:
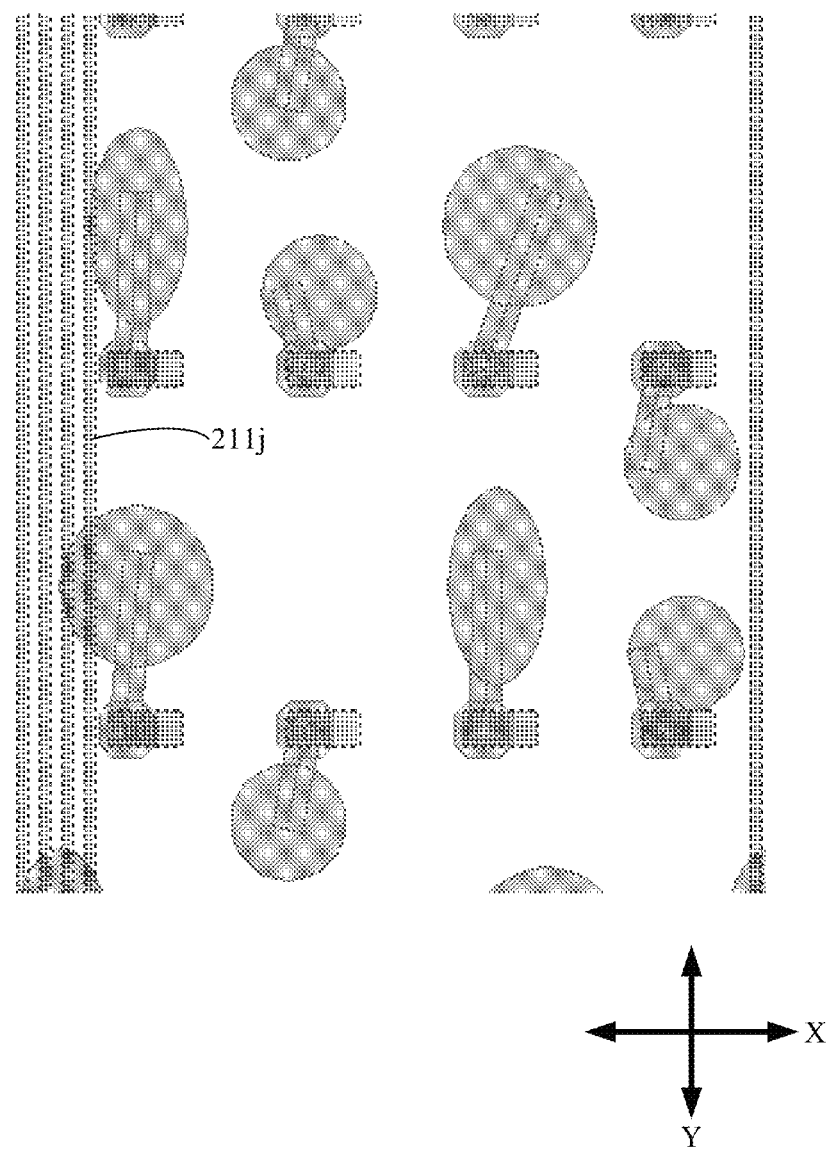
FIG. 23 shows a schematic diagram of the positional relationship between the anode and the ninth wiring in the structure shown in FIG. 20.

In the third section C, as shown in FIG. 21, each seventh lead 211g may include a seventh extension segment extending in the column direction Y. The orthographic projection on the base substrate 1 of the seventh extension segment is located in the pixel area and the assemble area of the sub-area, and does not overlap with the orthographic projection on the base substrate 1 of the assemble hole 23. As shown in FIG. 22, each eighth lead 211h may include an eighth extension segment 211ha extending in the row direction X, and the eighth extension segment 211ha is located in the pixel area of the sub-area. At least part of the eighth lead 211h may further include an eighth lead-out segment 211hb extending in the column direction Y. One end of the eighth lead-out segment 211hb is located in the pixel area of the sub-area and connected to an end of the seventh extension segment away from the first boundary 10111. The other end of the eighth lead-out segment 211hb is located in the assemble area of the sub-area and connected to the wiring part 3012 of an anode 301 through an assemble hole 23. As shown in FIG. 23, each ninth lead 211j may include a ninth extension segment extending in the column direction Y. The orthographic projection on the base substrate 1 of the ninth extension segment is located in the pixel area and the assemble area of the sub-area, and does not overlap with the orthographic projection on the base substrate 1 of the assemble hole 23.

It should be noted that the seventh lead 211g, the eighth lead 211h, and the ninth lead 211j in an embodiment of the present disclosure may be partial segments located in the third section C of a whole lead 211. The seventh lead 211g, the eighth lead 211h and the ninth lead 211j may be connected to the lead 211 provided on the same layer in other areas. For example, the eighth extension segment 211ha of the eighth lead 211h may be integrally connected and collinear with the second extension segment of the fifth lead 211e.

In addition, it should be noted that the arrangement density of the leads 211 in the third section C is smaller than the arrangement density of the leads 211 in the first section A and the second section B.

For example, in the third section C, the orthographic projections of part of the ninth extension segments and the seventh extension segment on the base substrate 1 overlap.

For example, in the sub-area of the third section C: as shown in FIG. 22, along the direction from the first boundary 10111 to the second boundary 10112, the length of the eighth lead-out segment 211hb gradually increases; the orthographic projections on the base substrate 1 of the center of the electrode part 3011 of at least one anode 301 and the seventh extension segment do not overlap.

Figure 20:
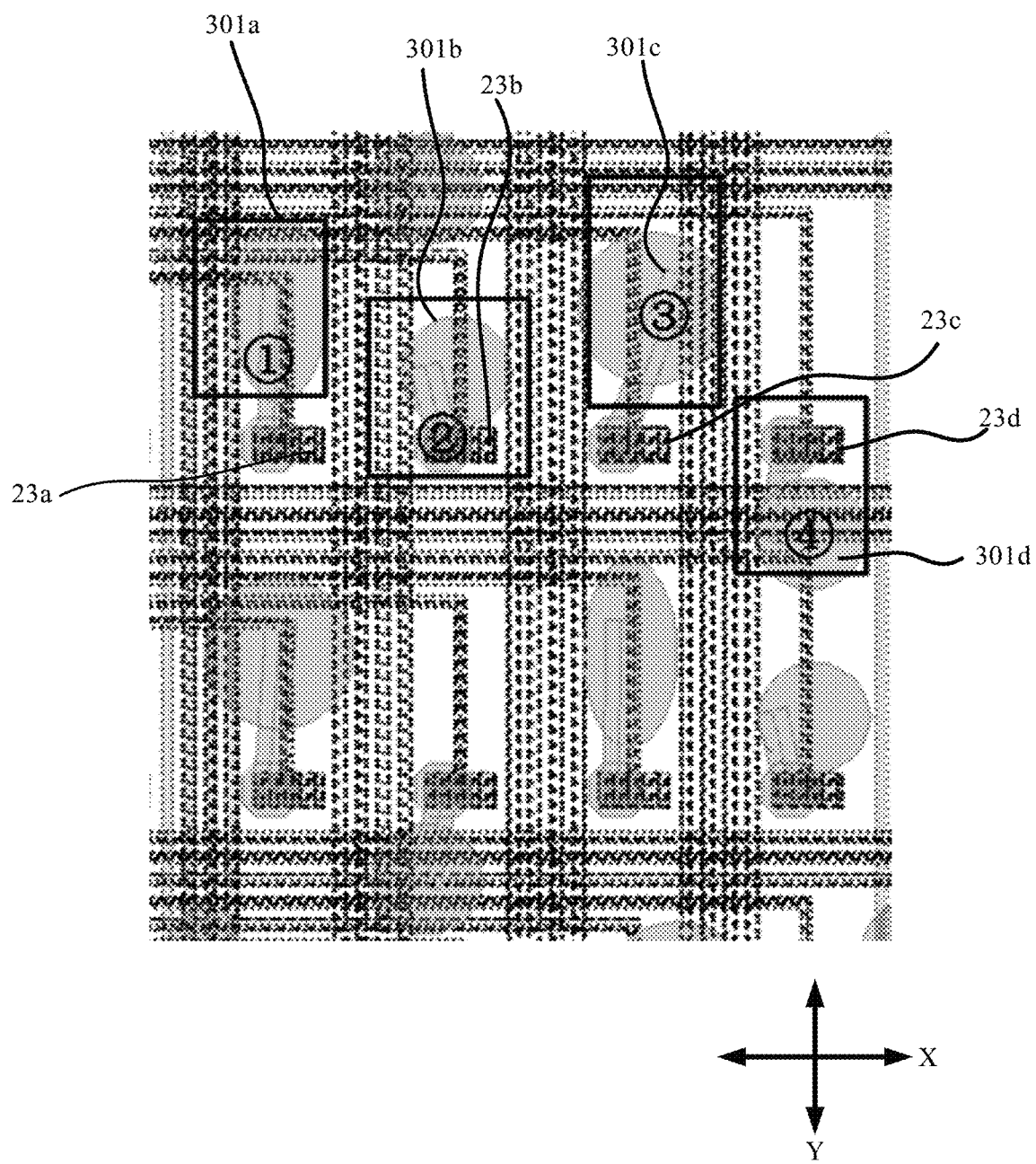
FIG. 20 shows a schematic diagram of at least partial structure of the third section of the first transparent display area shown in FIG. 9 or FIG. 10.

For example, in the sub-area of the third section C: as shown in FIGS. 20 to 21, orthographic projections on the base substrate 1 of the seventh extension segment (i.e., the seventh lead 211g) and the electrode part 3011 of at least one second anode 301a (the first anode 301a at position ① in FIG. 20), the electrode part 3011 of at least one second anode 301b (other second anodes 301b except for that at position ② in FIG. 20), and the electrode part 3011 of at least one fourth anode 301d (the fourth anode 301d at the position ④ in FIG. 20) do not overlap, and the orthographic projections on the base substrate 1 of the electrode part 3011 of at least one third anode 301c (the third anode 301c at position ③ in FIG. 20) and the seventh extension segment overlap.

In addition, in the third section C: the width of the seventh extension segment, the width of the eighth extension segment 211ha, the eighth lead-out segment 211hb, the width of the ninth extension segment, the distance between adjacent seventh extension segments, the distance between the adjacent eighth extension segments 211ha, and the distance between adjacent ninth extension segments are in the range from 1 μm to 3 μm, for example, 1 μm, 1.5 μm, 2 μm, 2.5 μm, 3 μm and so on.

In the third section C: as shown in FIG. 20 to FIG. 23, the numbers of the seventh extension segments and the ninth extension segments covered by the electrode part 3011 of the first anode 301a may be either 0 or 1, and the number of the eight extension segments 211ha covered at the same time may be from 1 to 3; the number of the seventh extension segments covered by the electrode part 3011 of the second anode 301b may be from 0 to 3, and the eighth extension segments 211ha and the ninth extension segments are not covered at the same time; the number of the seventh extension segments covered by the electrode part 3011 of the third anode 301c may be from 2 to 4, and the number of the eighth extension segments 211ha and the number of the sixth extension segments 211fa covered at the same time may be from 0 to 3; the number of the seventh extension segments covered by the electrode part 3011 of the fourth anode 301d may be from 0 to 3, the number of the eighth extension segments 211ha covered at the same time is from 4 to 6 and the ninth extension segments are not covered.

It should be noted that, in the third section C, the number of the extension segments of the leads 211 covered by the electrode part 3011 of each anode 301 is not limited to the above-mentioned values, and the specific number is related to the width of the extension segment and the difference between adjacent extension segments.

Figure 24:
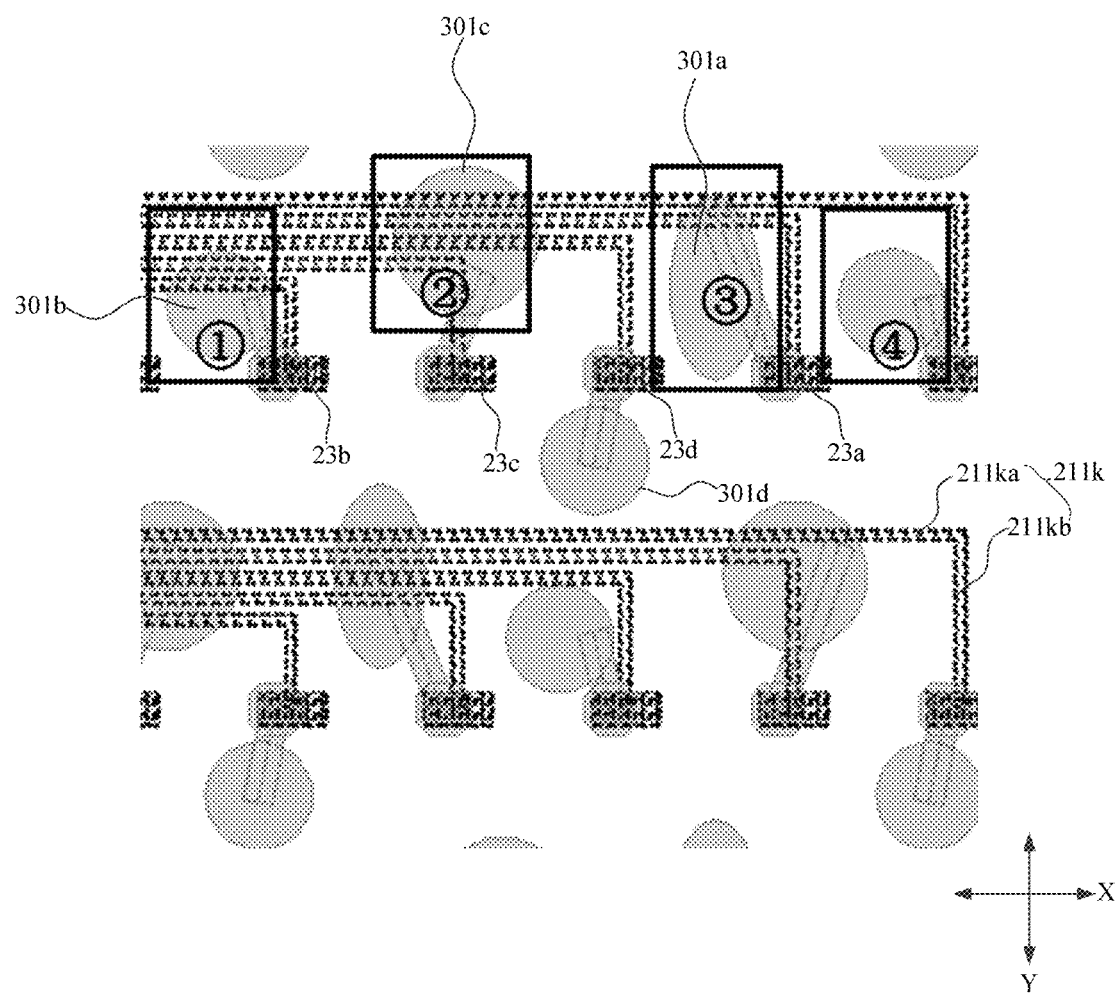
FIG. 24 shows a schematic diagram of at least partial structure of the fourth section of the first transparent display area shown in FIG. 9 or FIG. 10.
Figure 25:
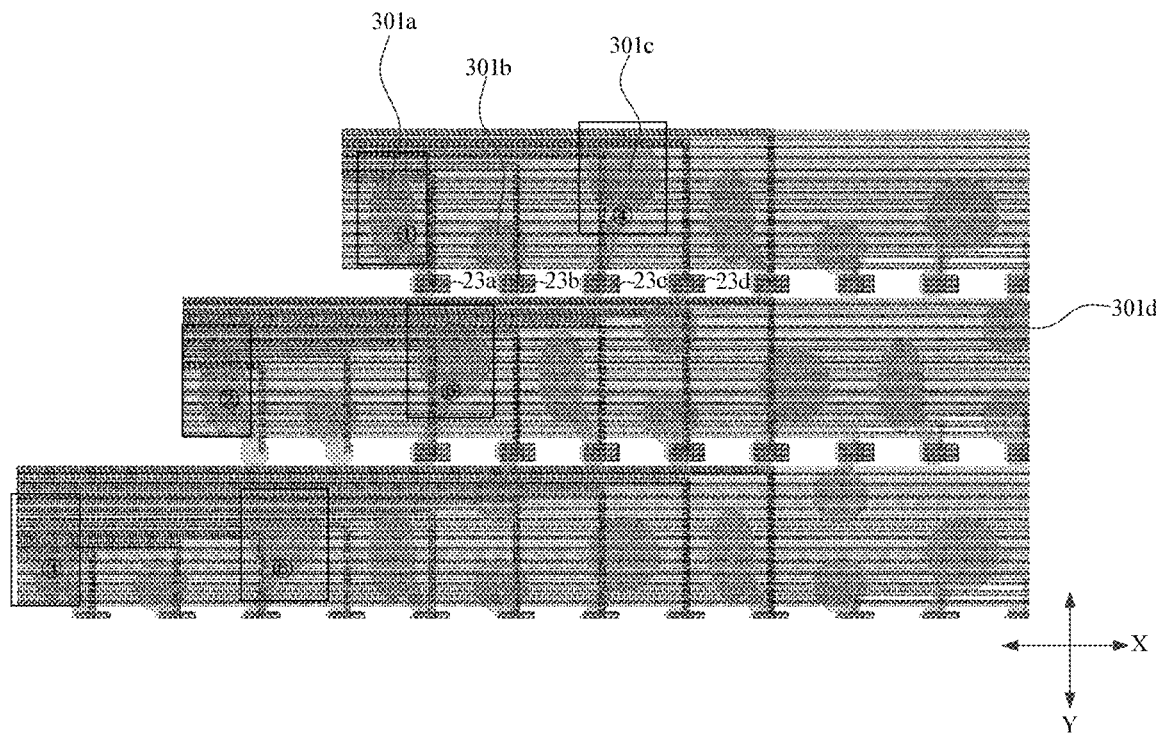
FIG. 25 is a schematic diagram showing at least partial structure of the third section of the first transparent display area according to an embodiment shown in FIG. 9 or FIG. 10.

In some embodiments of the present disclosure, the assemble layer 2 may further include a fourth assemble part located in the fourth section D. As shown in FIG. 24, the fourth assemble part includes a plurality of tenth leads 211k arranged on a same layer as the first lead 211a. Each tenth lead 211k includes a tenth extension segment 211ka extending in the row direction X and a tenth lead-out segment 211kb extending in the column direction Y. The tenth extension segment 211ka is located in the pixel area of the sub-area. One end of the tenth lead-out segment 211kb is located in the pixel area of the sub-area and connected to an end of the seventh extension segment away from the first boundary 10111. The other end of the tenth lead-out segment 211kb is located in the assemble area of the sub-area and connected to the wiring part 3012 of an anode 301 through an assemble hole 23.

For example, in the sub-area of the fourth section D: along the direction from the first boundary 10111 to the second boundary 10112, the number of the tenth extension segments 211ka gradually decreases, and the length of the tenth lead-out segment 211kb gradually increases; along the direction from the third boundary 10113 to the fourth boundary 10114, the length of the tenth extension segment 211ka gradually decreases.

It should be noted that, the tenth lead 211k in an embodiment of the present disclosure may be a partial segment located in the fourth section D of a whole lead 211. The tenth lead 211k may be connected to the leads 211 provided on the same layer in other areas.

In addition, it should be noted that the arrangement density of the leads 211 in the fourth section D is smaller than the arrangement density of the leads 211 in the third section C.

For example, in the sub-area of the fourth section D: the orthographic projections on the base substrate 1 of the top end of the electrode part 3011 of at least one first anode 301a (the first anode 301a at position ③ shown in FIG. 24) and the ten extension segment 211ka closest to the third boundary 10113 overlap; the orthographic projections on the base substrate 1 of the electrode part 3011 of 30 at least one second anode 301b (the second anode 301b at positions ① and ④ shown in FIG. 24) and the tenth lead-out segment 211kb do not overlap; and the orthographic projections on the base substrate 1 of the electrode part 3011 of at least one third anode 301c (the third anode 301c at position ② shown in FIG. 24) and the tenth extension segment 211ka and the tenth lead-out segment 211kb overlap.

In addition, in the fourth section D: the width of the tenth extension segment 211ka, the width of the tenth lead-out segment 211kb, and the distance between adjacent tenth extension segment 211ka are all within the range from 1 μm to 3 μm, for example, 1 μm, 1.5 μm, 2 μm, 2.5 μm, 3 μm, etc.

In the fourth section D: the number of the tenth extension segments 211ka covered by the electrode part 3011 of the first anode 301a may be from 0 or 1, and the number of the eighth extension segments 211ha covered at the same time may be from 1 to 5; the number of the tenth extension segments 211ka covered by the electrode part 3011 of the second anode 301b may be from 0 to 3; the number of the tenth extension segments 211ka covered by the electrode part 3011 of the third anode 301c may be from 1 to 5; and the tenth segment 211ka is not covered by the electrode part 3011 of the fourth anode 301d.

It should be noted that, in the fourth section D, the number of the extension segments of the leads 211 covered by the electrode part 3011 of each anode 301 is not limited to the above-mentioned values, and the specific number is related to the width of the extension segment and the difference between adjacent extension segments.

In some embodiments, the assemble layer 2 may further include a fifth assemble part located in the fifth section E. As shown in FIG. 25 to FIG. 32, the fifth assemble part includes a plurality of second wiring groups. Each of the second wiring groups corresponds to a sub-area of the fifth section E. The second wiring group includes an eleventh lead 211r provided on the same layer as the first lead 211a, a twelfth lead 211t provided on the same layer as the second lead 211b and a thirteenth lead 211p provided on the same layer as the third lead 211c.

The eleventh lead 211r may include an eleventh extension segment 211ra extending in the row direction X and an eleventh lead-out segment 211rb extending in the column direction Y. The eleventh extension section 211ra is located in the pixel area of the sub-area. One end of the eleventh lead-out segment 211rb is located in the pixel area of the sub-area and connected to an end of the eleventh extension segment 211ra away from the first boundary 10111. The other end of the eleventh lead-out segment 211rb is located in the assemble area of the sub-area and connected to the wiring part 3012 of an anode 301 through an assemble hole 23. The twelfth lead 211t includes a twelfth extension segment extending in the row direction X, and the twelfth extension segment is located in the pixel area of the sub-area. The thirteenth lead 211p includes a thirteenth extension segment 211pa extending in the row direction X. Thirteenth extension segment 211pa is located in the pixel area of the sub-area, and the thirteenth lead 211 that is partially away from the third boundary 10113 also includes a thirteenth lead-out segment 211pb extending in the column direction Y. One end of the thirteenth lead-out segment 211pb is located in the pixel area of the sub-area and connected to an end of the thirteenth extension segment 211pa away from the first boundary 10111. The other end of the thirteenth lead-out segment 211pb is located in the assemble area of the sub-area and connected to the wiring part 3012 of an anode 301 through an adapter hole 23.

Figure 27:
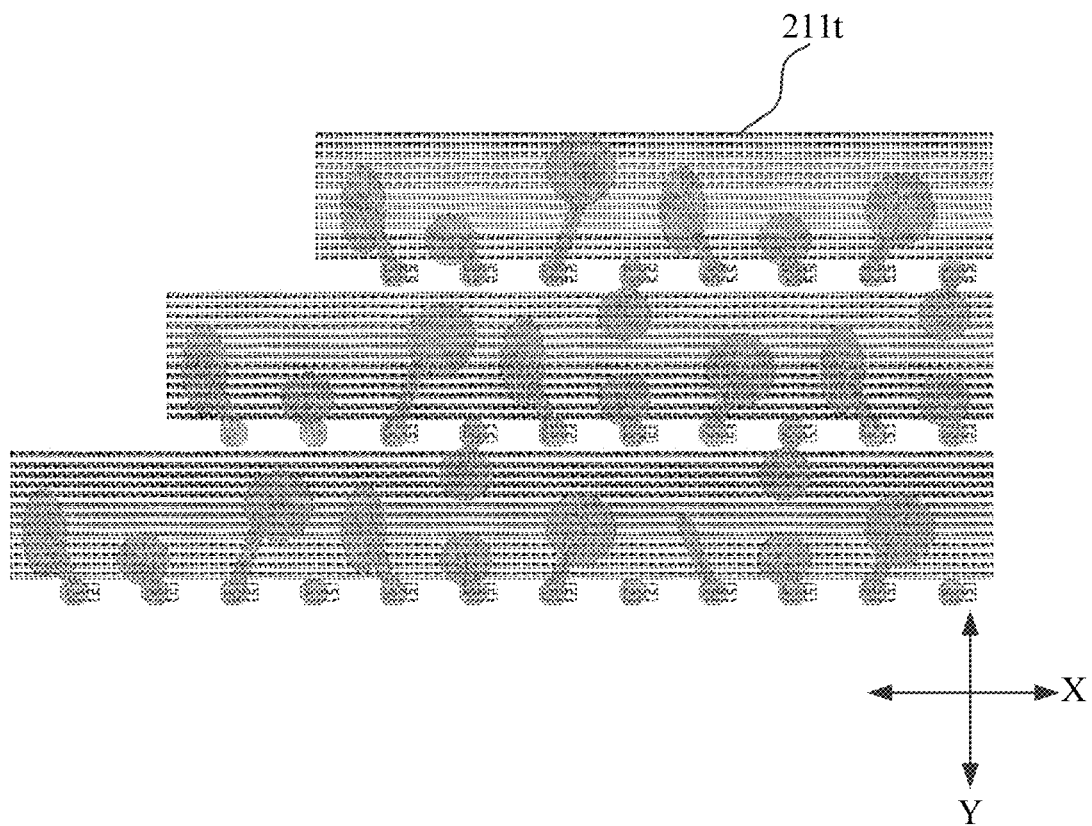
FIG. 27 shows a schematic diagram of the positional relationship between the anode and the twelfth wiring in the structure shown in FIG. 25.
Figure 31:
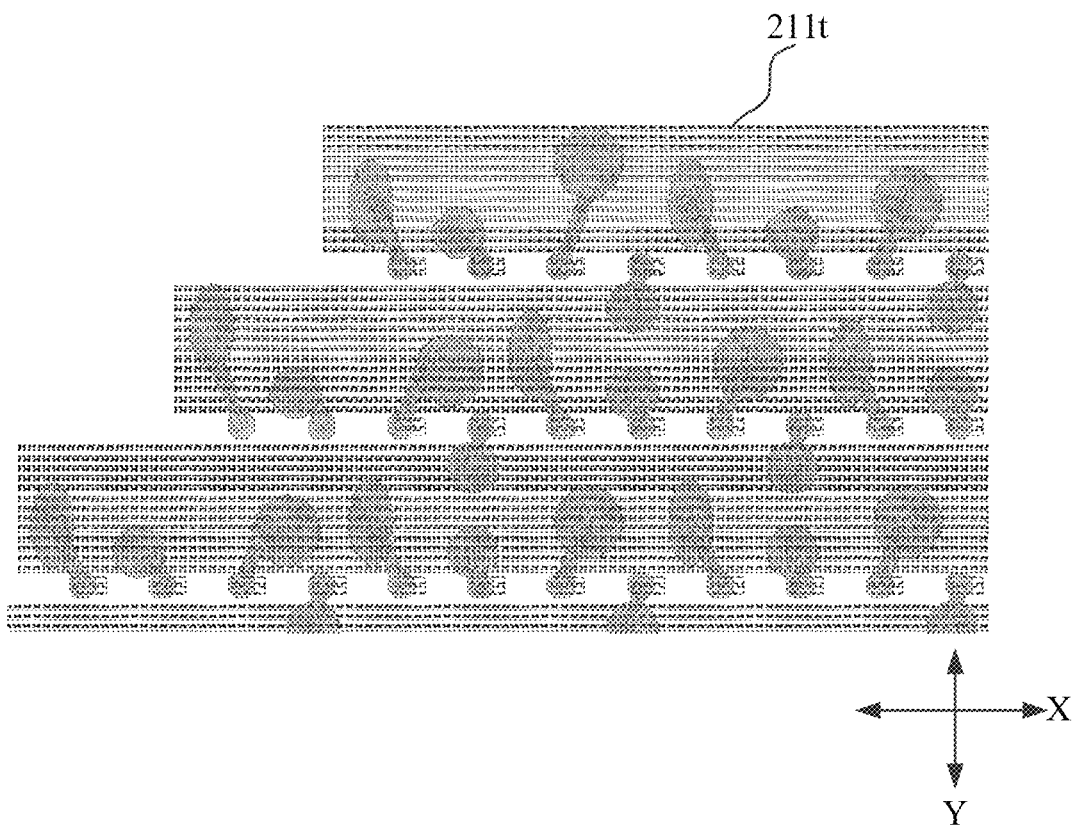
FIG. 31 shows a schematic diagram of the positional relationship between the anode and the twelfth wiring in the structure shown in FIG. 29.

Specifically, in each sub-area of the fifth section E, as shown in FIG. 27 and FIG. 31, the length of each twelfth extension segment (i.e., the twelfth lead 211t) is equal and both ends thereof are aligned. Along the direction from the third boundary 10113 to the fourth boundary 10114 in the fifth section E, the length of the twelfth extension segment in each sub-area increases gradually, and a segment close to the second boundary 10112 of the twelfth extension segment in each sub-area is arranged in alignment. In addition, the numbers of assemble holes 23 and anodes 301 in each sub-area gradually increase.

Figure 26:
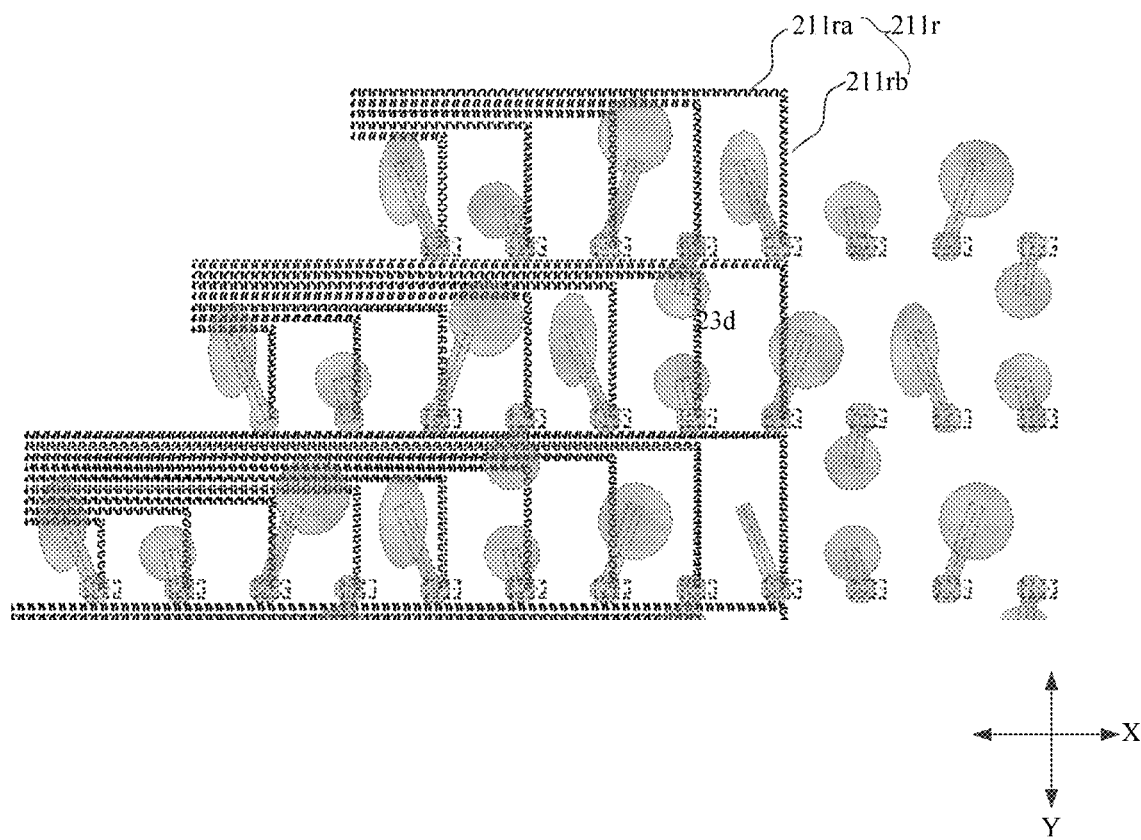
FIG. 26 shows a schematic diagram of the positional relationship between the anode and the eleventh wiring in the structure shown in FIG. 25.
Figure 30:
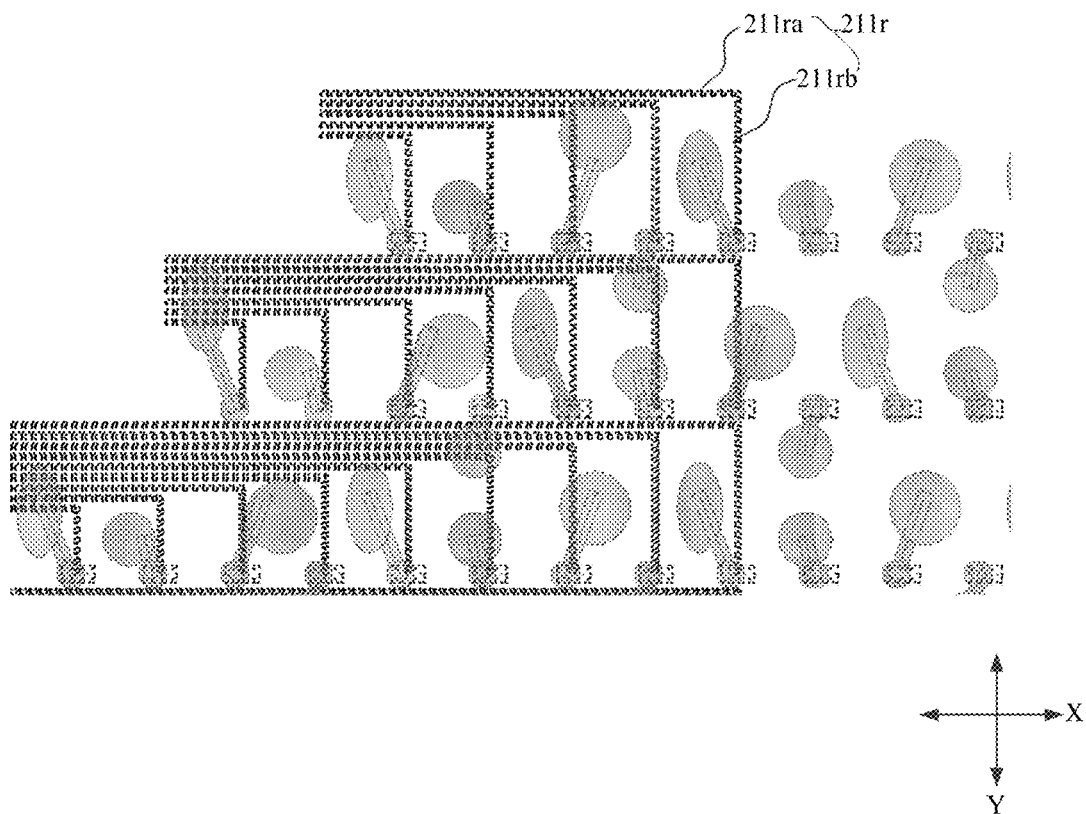
FIG. 30 shows a schematic diagram of the positional relationship between the anode and the eleventh wiring in the structure shown in FIG. 29.

For example, in the sub-area of the fifth section E, as shown in FIG. 26 and FIG. 30, along the direction from the first boundary 10111 to the second boundary 10112, the number of the eleventh extension segment 211ra gradually decreases, and the length of the eleventh lead-out segment 211rb gradually increases; and along the direction from the third boundary 10113 to the fourth boundary 10114, the length of the eleventh extension segment 211ra gradually decreases.

Figure 28:
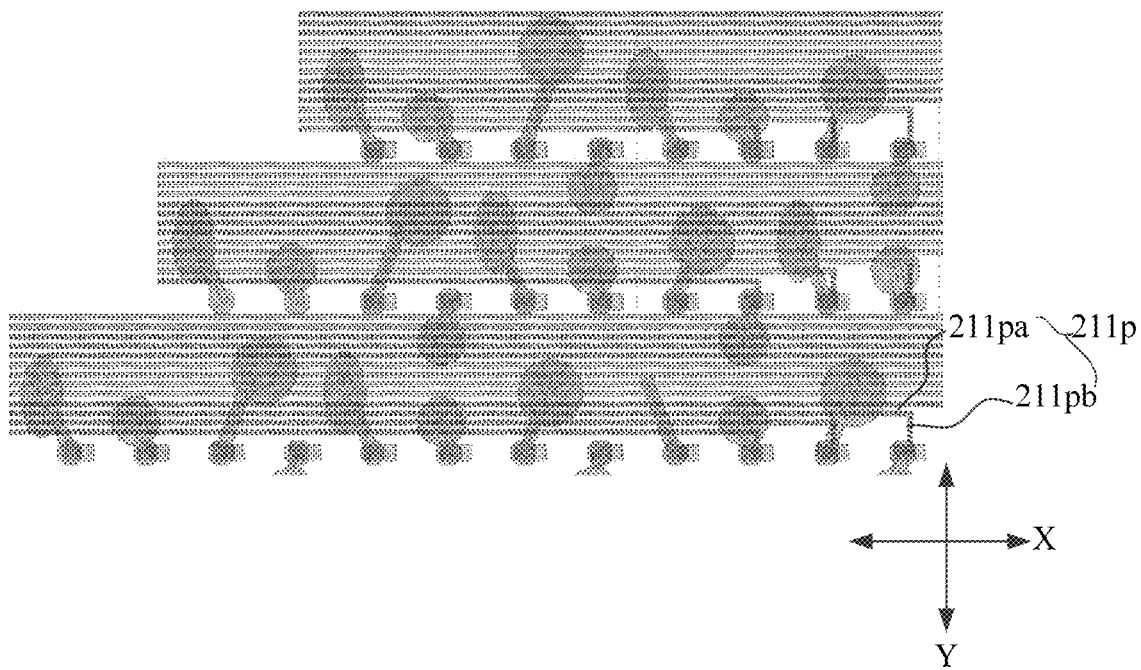
FIG. 28 shows a schematic diagram of the positional relationship between the anode and the thirteenth wiring in the structure shown in FIG. 25.
Figure 29:
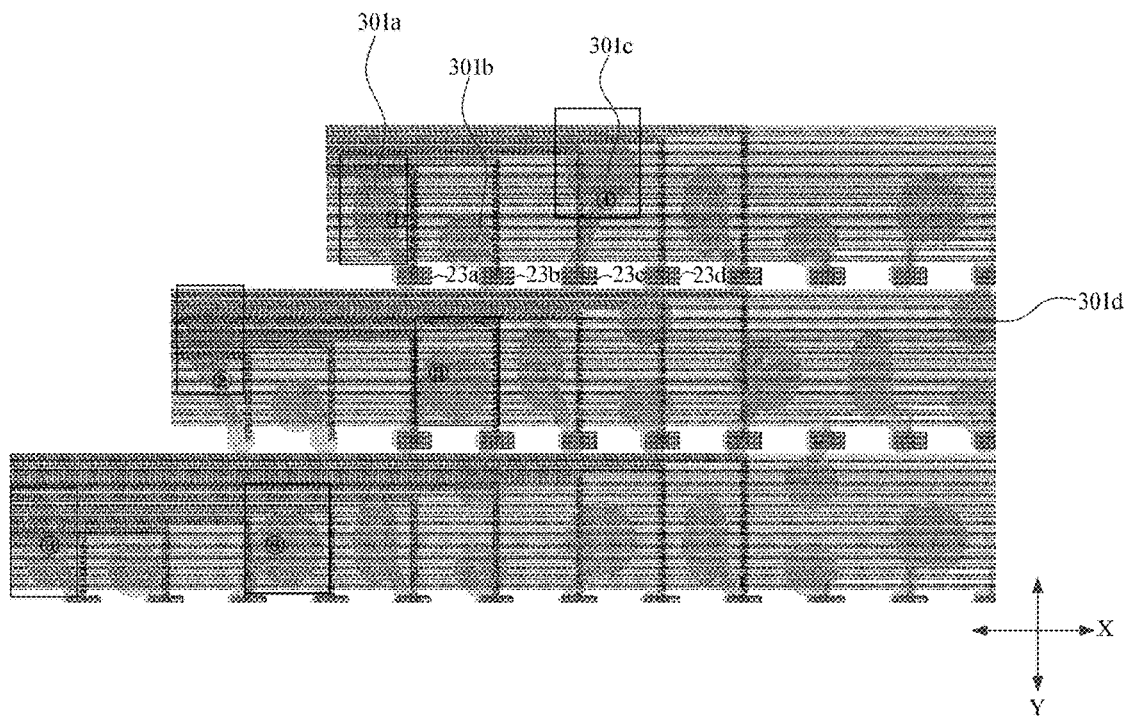
FIG. 29 is a schematic diagram showing at least partial structure of the third section of the first transparent display area according to another embodiment shown in FIG. 9 or FIG. 10.
Figure 32:
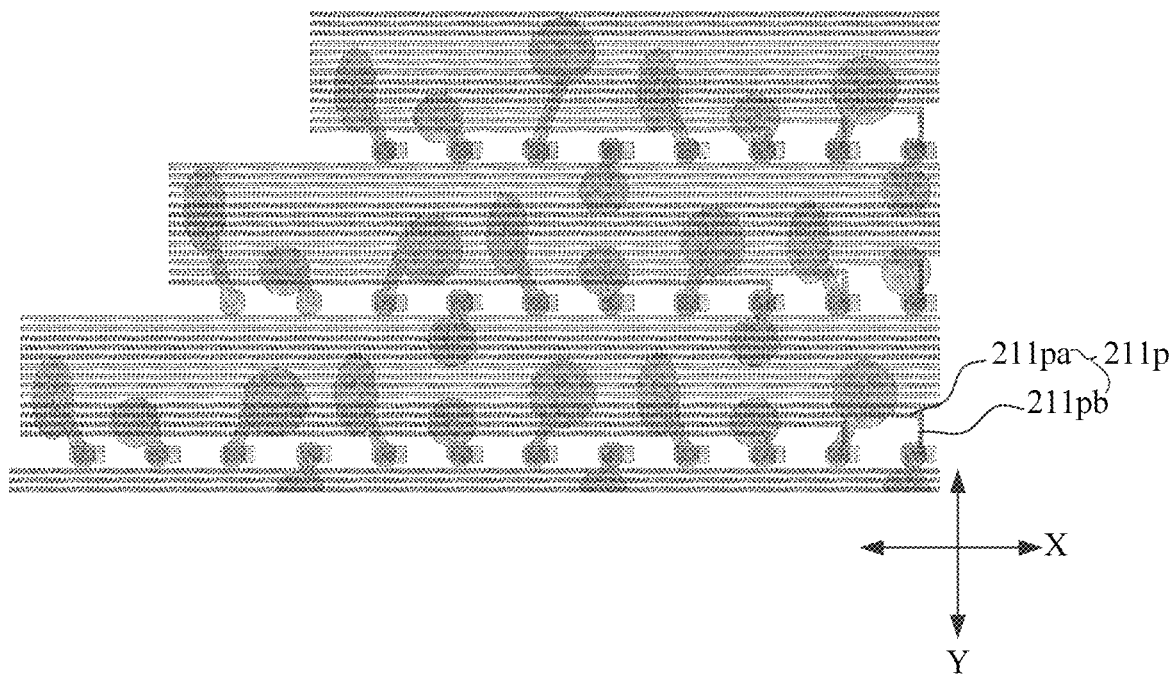
FIG. 32 shows a schematic diagram of the positional relationship between the anode and the thirteenth wiring in the structure shown in FIG. 29.

In addition, as shown in FIGS. 28 and 32, for each thirteenth lead 211p having the thirteenth lead-out segment 211pb in the sub-area of the fifth section E, along the direction from the first boundary 10111 to the second boundary 10112, the number of the thirteenth extension segments 211pa gradually decreases, and the length of the thirteenth lead-out segment 211pb gradually increases; and along the direction from the third boundary 10113 to the fourth boundary 10114, the length of the thirteenth extension segment 211pa gradually decreases.

It should be noted that, the eleventh lead 211r, the twelfth lead 211t, and the thirteenth lead 211p in an embodiment of the present disclosure may be partial segments located in the fourth section D of a whole lead 211. The eleventh lead 211r, the twelfth lead 211t, and the thirteenth lead 211p may be connected to the leads 211 disposed on the same layer in other areas.

In addition, it should be noted that the arrangement density of the leads 211 in the fifth section E is smaller than the arrangement density of the leads 211 in the first section A.

For example, in the sub-area of the fifth section E, the center of the electrode part 3011 of at least one first anode 301a (the first anodes 301a at positions ①, ②, and ③ shown in FIG. 25 and positions ① and ③ shown in FIG. 29) is located at a side of the center line of the pixel area close to the fourth boundary 10114.

For example, in the sub-area of the fifth section E, the center of the electrode part 3011 of at least one third anode 301c (the third anodes 301c at positions ④, ⑤ and ⑥ shown in FIG. 25 and the third anodes 301c at position ④ shown in FIG. 29) is located at a side of the center line of the pixel area close to the third boundary 10113.

For example, in the sub-area of the fifth section E, as shown in FIG. 25, FIG. 26, FIG. 29 and FIG. 30, orthographic projections on the base substrate 1 of the electrode part 3011 of at least one second anode 301b and the eleventh lead-out segment 211rb do not overlap.

For example, in the sub-area of the fifth section E, orthographic projections on the base substrate 1 of the electrode part 3011 of at least one third anode 301c (the third anodes 301c at positions ⑤ and ⑥ shown in FIG. 29) and the eleventh lead-out segment 211rb do not overlap.

In the fifth section E, the width of the eleventh extension segment 211ra, the width of the eleventh extension segment 211rb, the width of the twelfth extension segment, the width of the thirteenth extension segment 211pa, the width of the thirteenth lead-out segment 211pb, the distance between adjacent eleventh extension segments 211ra, the distance between adjacent twelfth extension segments, and the distance between adjacent thirteenth extension segments 211pa are all in the range from 1 μm to 3 μm, for example, 1 μm, 1.5 μm, 2 μm, 2.5 μm, 3 μm, etc.

In the fifth section E, the number of the eleventh extension segments 211ra covered by the electrode part 3011 of the first anode 301a is from 0 to 5, the number of the twelfth extension segments and the number of the thirteenth extension segments 211pa covered at the same time may be from 6 to 10; the number of the eleventh extension segments 211ra covered by the electrode part 3011 of the second anode 301b is 0, and the number of the twelfth extension segments and the number of the thirteenth extension segments 211pa covered at the same time may be from 2 to 6; the number of the eleventh extension segments 211ra covered by the electrode part 3011 of the third anode 301c may be from 0 to 3, the number of the twelfth extension segments and the number of the thirteenth extension segments 211pa covered at the same time may be from 6 to 8; the number of the first extension segments 211aa covered by the electrode part 3011 of the fourth anode 301d is from 0 to 5, and the number of the second extension segments and the number of the third extension segments covered at the same time may be from 4 to 6.

It should be noted that, in the fifth sub-area E, the number of the extension segments of the leads 211 covered by the electrode part 3011 of each anode 301 is not limited to the above-mentioned values, and the specific number is related to the width of the extension segment and the difference between adjacent extension segments.

Based on the aforementioned layout relationship between the leads 211 and the anodes 301 in the five sections, it can be known that the number and arrangement of the leads 211 in different sections may be different. Therefore, according to an embodiment of the present disclosure, the fine-tuning process performed in position of the anode 301 to balance the parasitic capacitance of the leads 211, so as to alleviate the mura phenomenon. Specifically, the methods used to adjust the position of the anode 301 in each section are mainly divided into the following types.

As a first type, when there are different densities of leads 211 in the sub-areas of the section, the anode 301 may be moved to the place where the leads 211 are relatively sparse.

As a second type, for the anode 301 with the lead 211 extending in the row direction Y below, the position of the anode 301 may be adjusted in the row direction X to avoid the lead 211 extending in the column direction Y.

As a third type, the anode 301 and the lead 211 are kept in a state of no overlap or little overlap, or the area of the lead 211 where the anode 301 overlaps therewith is kept the same.

Specifically, in the actual moving process, the overlapping area may be calculated or the capacitance may be extracted by using simulation softwares to balance the parasitic capacitance in each area.

In some embodiments of the present disclosure, the aforementioned leads 211 in the first transparent display area 1011a and the leads 211 in the second transparent display area 1011b may be symmetrically arranged with respect to the column direction Y. The leads 211 in the third transparent display area 1011c and the leads 211 in the fourth transparent display area 1011d are arranged symmetrically with respect to the column direction Y. The leads 211 in the first transparent display area 1011a and the leads 211 in the third transparent display area 1011c are arranged symmetrically with respect to the row direction X. The leads 211 in the first transparent display area 1011b and the leads 211 in the fourth transparent display area 1011d are arranged symmetrically with respect to the row direction X. This helps to reduce the difficulty in design. But it is worth noting that the leads 211 in each transparent display area 1011 may also be arranged symmetrically with the leads 211 in some sections 211. The leads 211 in other sections may be arranged in translation. Alternatively, the arrangement of the leads 211 in each transparent display area 1011 may also be different, depending on the specific situations.

Figure 33:
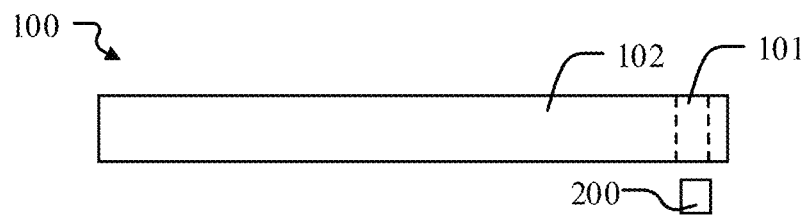
FIG. 33 shows a schematic diagram of a terminal device according to an embodiment of the present disclosure.

An embodiment of the present disclosure further provides a terminal device. As shown in FIG. 33, the terminal device may include a display panel 100 and a camera device 200.

The display panel 100 may be the display panel in any of the above-mentioned embodiments, and its structure and beneficial effects may be referred to the above-mentioned embodiments of the display panel, which will not be repeated here.

The camera device 200 may be disposed on the backlight side of the display panel 100, that is, the back side along the light-emitting direction. For example, the OLED light-emitting device 30 of the display panel 100 is a top emission structure. That is, the camera device 200 emits light in a direction away from the substrate 1. The camera device 200 may be disposed on the side of the base substrate 1 away from the light-emitting layer 3. The camera device 200 may be directly opposite to the light transmissive area 101 for capturing images through the light transmissive area 101. If the OLED light emitting device 30 of the display panel 100 is a bottom emission structure, the camera device 200 may be disposed on the side of the light emitting layer 3 away from the base substrate 1. The camera device 200 may include a lens, a photoelectric sensor, etc. The specific structure of the camera device 200 is not particularly limited here, as long as it can capture images.

The terminal device according to an embodiment of the present disclosure may be a terminal device with display and shooting functions, such as a mobile phone, a tablet computer, a TV, etc., which will not be listed one by one here.

Other embodiments of the present disclosure will readily occur to those skilled in the art upon consideration of the specification and practice of the content disclosed herein. The present disclosure is intended to cover any variations, uses, or adaptations of the present disclosure that follow the general principles of the present disclosure and include common general knowledge or techniques in the technical field not disclosed by the present disclosure. The specification and examples are to be regarded as exemplary only, with the true scope and spirit of the present disclosure being indicated by the appended claims.

The invention claimed is:

1. A display panel, comprising:
   a base substrate,
   an assemble layer located on the base substrate, and
   an anode layer located on a side of the assemble layer away from the base substrate, wherein
   the base substrate comprises a light transmissive area, the light transmissive area comprises at least one transparent display area, and the transparent display area comprises a first boundary and a second boundary being opposite in a row direction, and a third boundary and a fourth boundary being opposite in a column direction, wherein the transparent display area comprises at least one section, the at least one section comprises a plurality of rows of sub-areas arranged in the column direction, the sub-areas comprise a row of pixel areas and a row of assemble areas arranged sequentially in the column direction, the assemble area is provided with an assemble hole, and the at least one section comprises a first section;

the assemble layer comprises a plurality of leads, some of the plurality of leads are located in the first section, and in a sub-area of the first section, a number of the leads gradually decreases along a direction from the first boundary to the second boundary, and a size of the leads in the row direction gradually decrease along a direction from the third boundary to the fourth boundary;

the anode layer comprises a plurality of anodes, the anodes have an electrode part and a wiring part connected to the electrode part, at least part of the electrode part is located in a pixel area, at least part of the wiring part is located in the assemble area and connected to part of the leads located in the assemble area through the assemble hole; and the plurality of anodes at least comprise a plurality of first anodes, the plurality of first anodes at least comprise a first reference anode and a first offset anode located in the sub-area of the first section and arranged at intervals in the row direction, and in the column direction, a center of the electrode part of the first offset anode is located at a side of a center of the electrode part of the first reference anode close to the third boundary.

2. The display panel according to claim 1, wherein the first section comprises N rows of sub-areas, wherein N is a positive integer greater than 1;

in the pixel area of the sub-area in the n-th row of the first section, the first offset anode is located at a side of the first reference anode close to the second boundary;

in the pixel area of the sub-area in the (n+1)-th row of the first section, the first offset anode is located at a side of the first reference anode close to the first boundary;

in the row direction, the first reference anode in the pixel area of the sub-area in the n-th row of the first section is located at a side of the first offset anode in the pixel area of the sub-area in the (n+1)-th row of the first section close to the first boundary; and in the row direction, the first offset anode in the pixel area of the sub-area in the n-th row of the first section is located between the first offset anode and the first reference anode in the pixel area of the sub-area in the (n+1)-th row of the first section, wherein, 1≤n<N, and n is a positive integer.

3. The display panel according to claim 1, wherein the plurality of anodes comprise a plurality of anode groups, the anode group comprises the first anode, a second anode, a third anode, and a fourth anode, the second anode and the fourth anode have a same light emission color, and the first anode, the second anode and the third anode have different light emission colors;

the assemble area of the sub-area is provided with a plurality of assemble hole groups arranged at intervals in the row direction; and the assemble hole group comprises four assemble holes arranged at intervals in the row direction, and the four assemble holes are respectively defined as a first assemble hole correspondingly connected with the first anode, a second assemble hole correspondingly connected with the second anode, and a third assemble hole correspondingly connected with the third anode, and a fourth assemble hole correspondingly connected with the fourth anode.

4. The display panel according to claim 3, wherein, in the anode group, the wiring parts in the first anode, the second anode, the third anode, and the fourth anode are in one-to-one correspondence with the assemble holes in a same assemble area; and at least 30% of the electrode parts in the first anode, the second anode, and the third anode are located in the pixel area of the sub-area in a same row, and at least 30% of the electrode part in the fourth anode is located in the pixel area of the sub-area in an adjacent row.

5. The display panel according to claim 3, wherein in the assemble hole group, the first assemble hole, the second assemble hole, the third assemble hole, and the fourth assemble hole are arranged sequentially in the row direction, or the third assemble hole, the fourth assemble hole, the first assemble hole, and the second assemble hole are arranged sequentially in the row direction; and among two adjacent assemble hole groups in the column direction, the first assemble hole of one assemble hole group is located in a same row as the third assemble hole of the other assemble hole group, and the second assemble hole of one assemble hole group is located in a same row as the fourth assemble hole of the other assemble hole group.

6. The display panel according to claim 3, wherein the assemble layer comprises a first assemble part located in the first section, the first assemble part comprises a plurality of first wiring groups arranged in the column direction, and each of the plurality of first wiring groups corresponds to the sub-area of the first section; and the first wiring group comprises a first lead, a second lead, and a third lead arranged sequentially along a direction from the base substrate to the anode layer and insulated from each other, wherein the first lead comprises a first extension segment extending in the row direction and a first lead-out segment extending in the column direction, the first extension segment is located in the pixel area of the sub-area, an end of the first lead-out segment is located in the pixel area of the sub-area and connected to an end of the first extension segment away from the first boundary, and the other end of the first lead-out segment is located in the assemble area of the sub-area and connected to a wiring part of the anode through an assemble hole; and/or the second lead comprises a second extension segment extending in the row direction, and the second extension segment is located in the pixel area of the sub-area; and/or the third lead comprises a third extension segment extending in the row direction, and the third extension segment is located in the pixel area of the sub-area.

7. The display panel according to claim 6, wherein, in the sub-area of the first section, along a direction from the first boundary to the second boundary, a number of the first extension segments gradually decreases, and a length of the first lead-out segment gradually increases; and along a direction from the third boundary to the fourth boundary, a length of the first extension segment gradually decreases; and/or along a direction from the first boundary to the second boundary, numbers of the second extension segments and the third extension segments are unchanged.

8. The display panel according to claim 6, wherein, in the sub-area of the first section, an overlapping area on the base substrate between at least one of the first extension segments and the third extension segment is larger than an overlapping area on the base substrate between the at least one of the first extension segments and the second extension segment.

9. The display panel according to claim 6, wherein the pixel area of the sub-area comprises a center line extending in the row direction, the center line is separated by a first distance from an extension segment closest to the third boundary among the first extension segment, the second extension segment and the third extension segment of the first wiring group, the center line is separated by a second distance from an extension segment farthest from the third boundary among the first extension segment, the second extension segment and the third extension segment of the first wiring group, the first distance and the second distance are dimensions in the column direction, and the first distance and the second distance are equal to each other; and in the sub-area of the first section, a center of the electrode part of the first offset anode is located at a side close to the third boundary of the center line of the pixel area where it is located.

10. The display panel according to claim 9, wherein, in the sub-area of the first section, a center of the electrode part of at least one of the first reference anodes is located at a center line of the pixel area where it is located.

11. The display panel according to claim 6, wherein in the sub-area of the first section, an overlap exists between orthographic projections on the base substrate of an top end of at least part of the electrode part of the first offset anode and an extension segment closest to the third boundary among the first extension segment, the second extension segment and the third extension segment of the first wiring group.

12. The display panel according to claim 6, wherein, in the first section, no overlap exists between orthographic projections on the base substrate of the first lead-out segment and the electrode part of at least one of the second anodes; and/or an overlap exists between orthographic projections on the base substrate of the first lead-out segment and the electrode part of at least one of the second anodes.

13. The display panel according to claim 6, wherein, in the first section, an overlap exists between orthographic projections on the base substrate of an extension segment farest from the third boundary among the first extension segment, the second extension segment and the third extension segment of the first wiring group and a bottom end of the electrode part of at least one of the third anodes; and/or no overlap exists between an orthographic projection on the base substrate of the electrode part of at least one of the third anodes and an orthographic projection on the base substrate of the first lead-out segment.

14. The display panel according to claim 6, wherein, in the first section, no overlap exists between orthographic projections on the base substrate of a bottom end of the electrode part of at least one of the third anodes and an extension segment farthest from the third boundary among the first extension segment, the second extension segment and the third extension segment of the first wiring group;

an overlap exists between orthographic projections on the base substrate of the first lead-out segment and the electrode part of at least one of the third anodes; and/or no overlap exists between orthographic projections on the base substrate of the first lead-out segment and the electrode part of each of the fourth anodes.

15. The display panel according to claim 3, wherein the at least one section of the transparent display area further comprises a second section, and the second section is located at a side of the first section close to the second boundary; and the assemble layer further comprises a second assemble part located in the second section, the second assemble part comprises a plurality of fourth leads arranged on a same layer as the first lead, a plurality of fifth leads arranged on a same layer as the second lead, and a plurality of sixth leads arranged on a same layer as the third lead, wherein the fourth lead comprises a fourth extension segment extending in the column direction, and an orthographic projection on the base substrate of the fourth extension segment is located in the pixel area and the assemble area of the sub-area, and does not overlap with an orthographic projection on the base substrate of the assemble hole; and/or the fifth lead comprises a fifth extension segment extending in the row direction, and the fifth extension segment is located in the pixel area of the sub-area; and/or the sixth lead comprises a sixth extension segment extending in the row direction, the sixth extension segment is located in the pixel area of the sub-area, at least part of the sixth lead further comprises a sixth lead-out segment extending in the column direction, an end of the sixth lead-out segment is located in the pixel area of the sub-area and connected to an end of the sixth extension segment away from the first boundary, and the other end of the sixth lead-out segment is located in the assemble area of the sub-area and connected to the wiring part of an anode through an assemble hole.

16. The display panel according to claim 15, wherein, in the sub-area of the second section, along a direction from the first boundary to the second boundary, a length of the sixth lead-out segment gradually increases; and/or no overlap exists between orthographic projections on the base substrate of the fourth extension segment and a center of the electrode part of at least one anode.

17. The display panel according to claim 15, wherein, in the sub-area of the second section, no overlap exists between orthographic projections on the base substrate of the fourth extension segment and the electrode part of at least one of the first anodes and; and/or an overlap exists between orthographic projections on the base substrate of the fifth extension segment closest to the fourth boundary and a bottom end of the electrode part of at least one of the first anodes; and/or an overlap exists between orthographic projections on the base substrate of the fifth extension segment closest to the third boundary and a top end of the electrode part of at least one of the third anodes.

18. The display panel according to claim 15, wherein the at least one section of the transparent display area further comprises a third section, and the third section is located at a side of the second section away from the first section; and the assemble layer further comprises a third assemble part located in the third section, and the third assemble part comprises a plurality of seventh leads arranged on a same layer as the first lead, a plurality of eighth leads arranged on a same layer of the second lead, and a plurality of ninth leads arranged on a same layer as the third lead, wherein the seventh lead comprises a seventh extension segment extending in the column direction, and an orthographic projection on the base substrate of the seventh extension segment is located in the pixel area and the assemble area of the sub-area, and does not overlap with an orthographic projection on the base substrate of the assemble hole; and/or the eighth lead comprises an eighth extension segment extending in the row direction, the eighth extension segment is located in the pixel area of the sub-area, at least part of the eighth lead further comprises an eighth lead-out segment extending in the column direction, an end of the eighth lead-out segment is located in the pixel area of the sub-area and connected to an end of the seventh extension segment away from the first boundary, and the other end of the eighth lead-out segment is located in the assemble area of the sub-area and connected to the wiring part of an anode through an assemble hole; and/or the ninth lead comprises a ninth extension segment extending in the column direction, and an orthographic projection on the base substrate of the ninth extension segment is located in the pixel area and the assemble area of the sub-area, and does not overlap with an orthographic projection on the base substrate of the assemble hole.

19. The display panel according to claim 18, wherein an overlap exists between orthographic projections on the base substrate of the seventh extension segment and a part of the ninth extension segment.

20. A terminal device, comprising a display panel, wherein the display panel comprises:

a base substrate, an assemble layer located on the base substrate, and an anode layer located on a side of the assemble layer away from the base substrate, wherein the base substrate comprises a light transmissive area, the light transmissive area comprises at least one transparent display area, and the transparent display area comprises a first boundary and a second boundary being opposite in a row direction, and a third boundary and a fourth boundary being opposite in a column direction, wherein the transparent display area comprises at least one section, the at least one section comprises a plurality of rows of sub-areas arranged in the column direction, the sub-areas comprise a row of pixel areas and a row of assemble areas arranged sequentially in the column direction, the assemble area is provided with an assemble hole, and the at least one section comprises a first section;

the assemble layer comprises a plurality of leads, some of the plurality of leads are located in the first section, and in a sub-area of the first section, a number of the leads gradually decreases along a direction from the first boundary to the second boundary, and a size of the leads in the row direction gradually decrease along a direction from the third boundary to the fourth boundary;

the anode layer comprises a plurality of anodes, the anodes have an electrode part and a wiring part connected to the electrode part, at least part of the electrode part is located in a pixel area, at least part of the wiring part is located in the assemble area and connected to part of the leads located in the assemble area through the assemble hole; and the plurality of anodes at least comprise a plurality of first anodes, the plurality of first anodes at least comprise a first reference anode and a first offset anode located in the sub-area of the first section and arranged at intervals in the row direction, and in the column direction, a center of the electrode part of the first offset anode is located at a side of a center of the electrode part of the first reference anode close to the third boundary.

\* \* \* \* \*